(12) United States Patent
Kappes et al.

(10) Patent No.: US 7,369,816 B2
(45) Date of Patent: *May 6, 2008

(54) HIGHLY ACCURATE TEMPERATURE SENSOR EMPLOYING MIXED-SIGNAL COMPONENTS

(75) Inventors: Michael Steven Kappes, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 10/912,837

(22) Filed: Aug. 6, 2004

(65) Prior Publication Data

US 2006/0030274 A1   Feb. 9, 2006

(51) Int. Cl.
  *H04B 1/38*  (2006.01)
  *H03G 3/10*  (2006.01)
  *H03G 3/18*  (2006.01)
  *H03G 3/30*  (2006.01)

(52) U.S. Cl. .................. 455/73; 455/127.1; 455/127.2; 455/67.11; 455/86; 455/75; 455/115.1; 455/84; 455/85; 330/256; 330/266; 330/272; 330/289; 330/279; 330/102; 330/127; 330/101

(58) Field of Classification Search .................. 455/73, 455/13.1, 234.1, 276.1, 127.5, 183.1, 75, 455/127.2, 127.1, 67.11, 115.1, 84, 85, 86; 375/322, 133, 345; 374/178; 702/130, 132, 702/181; 330/256, 266, 272, 289, 279
See application file for complete search history.

(56) References Cited

U.S. PATENT DOCUMENTS

| | | | | |
|---|---|---|---|---|
| 5,448,770 A | * | 9/1995 | Hietala et al. | 455/126 |
| 5,781,075 A | * | 7/1998 | Bolton et al. | 331/176 |
| 6,342,997 B1 | * | 1/2002 | Khadkikar et al. | 361/103 |
| 6,366,622 B1 | * | 4/2002 | Brown et al. | 375/322 |
| 6,476,392 B1 | * | 11/2002 | Kaufman et al. | 250/332 |
| 6,567,763 B1 | * | 5/2003 | Javanifard et al. | 702/130 |
| 7,046,959 B2 | * | 5/2006 | Ammar et al. | 455/13.1 |
| 7,068,985 B2 | * | 6/2006 | Quilisch et al. | 455/127.2 |
| 7,118,273 B1 | * | 10/2006 | Schnaitter | 374/168 |
| 7,120,393 B2 | * | 10/2006 | Behzad et al. | 455/73 |
| 2003/0138034 A1 | * | 7/2003 | Shi et al. | 375/219 |
| 2006/0097135 A1 | * | 5/2006 | Al-Ali | 455/13.1 |

* cited by examiner

*Primary Examiner*—Lana Le
*Assistant Examiner*—Muhammad Akbar
(74) *Attorney, Agent, or Firm*—Garlick, Harrison & Markison; James A. Harrison

(57) ABSTRACT

A radio transceiver includes circuitry that enables received RF signals to be down-converted to baseband frequencies and baseband signals to be up-converted to RF signals prior to transmission without requiring conversion to an intermediate frequency. The circuitry includes a temperature sensing module that produces accurate voltage level readings that may be mapped into corresponding temperature values. A processor, among other actions, adjusts gain level settings based upon detected temperature values. One aspect of the present invention further includes repetitively inverting voltage signals across a pair of semiconductor devices being used as temperature sensors to remove a common mode signal to produce an actual temperature-voltage curve. In one embodiment of the invention, the circuitry further includes a pair of amplifiers to facilitate setting a slope of the voltage-temperature curve.

26 Claims, 15 Drawing Sheets

FIG. 1 analog amplification prior to sampling

HIGHLY ACCURATE TEMPERATURE SENSOR EMPLOYING MIXED-SIGNAL COMPONENTS

CROSS-REFERENCE TO RELATED APPLICATIONS

The present U.S. Utility Patent Application claims priority pursuant to 35 U.S.C. § 120, as a continuation-in-part (CIP), to the following U.S. Utility Patent Applications which are hereby incorporated herein by reference in their entirety and made part of the present U.S. Utility Patent Application for all purposes:
1. U.S. Utility Application Ser. No. 10/052,870 entitled "Direct Conversion RF Transceiver for Wireless Communications," (Attorney Docket No. BP1985), filed Jan. 18, 2002, now U.S. Pat. No. 7212586 issued May 1, 2007.
2. U.S. Utility Application Ser. No. 10/255,378 entitled "Direct Conversion RF Transceiver with Automatic Frequency Control," (Attorney Docket No. BP2348.1), filed Sep. 26, 2002, now U.S. Pat. No. 7,224,722 issued May 29, 2007.
3. U.S. Utility Application Ser. No. 10/274,655 entitled Fast Settling Variable Gain Amplifier with DC Offset Cancellation," (Attorney Docket No. BP2268), filed Oct. 21, 2002, now U.S. Pat. No. 7,020,449 issued Mar. 28, 2006.

BACKGROUND

1. Technical Field

This invention relates generally to communication systems and, more particularly, to Radio Frequency (RF) signal amplification within wireless devices operating in wireless communication systems.

2. Related Art

Communication systems are known to support wireless and wire lined communications between wireless and/or wired communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocol (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel of the other parties (e.g., one of the plurality of radio frequency (RF) carriers of the wireless communication system) and exchange information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network (PSTN), via the Internet, and/or via some other wire lined or wireless network.

Each wireless communication device includes a built-in radio transceiver (i.e., receiver and transmitter) or is coupled to an associated radio transceiver (e.g., a station for in-home and/or in-building wireless communication networks, RF modem, etc.) to participate in wireless communications. As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As is also known, the receiver is coupled to the antenna and includes a low noise amplifier (LNA), zero or more intermediate frequency (IF) stages, a filtering stage, and a data recovery stage in many designs. The low noise amplifier receives an inbound RF signal via the antenna and amplifies it. The down converters mix the amplified RF signal with one or more local oscillations to convert the amplified RF signal into a baseband signal or an intermediate frequency signal. As used herein, the term "low IF" refers to both baseband and low intermediate frequency signals. A filtering stage filters the low IF signals to attenuate unwanted out of band signals to produce a filtered signal. The data recovery stage recovers raw data from the filtered signal in accordance with the particular wireless communication standard.

There is a need today for a wireless transceiver system that allows for full integration of circuit designs that support high data rate and wideband communications. Stated differently, there is a need for wireless transceiver systems formed on an integrated circuit that have the capability to convert between baseband and a specified RF band in a single step to avoid the image rejection problems that are commonly known for IF approach. Thus, it is desirable to design direct conversion radio transceivers to allow a transceiver to be built on one integrated circuit without any image problem.

As the demand increases for enhanced performance (e.g., reduced interference and/or noise, improved quality of service, compliance with multiple standards, increased broadband applications, etc.), smaller sizes, lower power consumption, and reduced costs, engineers are faced with a very difficult design challenge to develop such a wireless communication device.

To minimize the size and number of discrete circuits within a device, there is a desire to incorporate power amplifiers into a single device on a radio transceiver integrated circuit or device. One problem with integrating radio transceiver circuits with power amplifiers, however, is that the power amplifiers generate significant temperatures that affect device reliability and/or operation. An additional need exists, therefore, for an integrated power amplifier within a transceiver device that addresses the various problems related to increased temperatures generated by the power amplifier of an integrated circuit or device. It is desirable to monitor the temperature of the power amplifier (PA) and to control the power level to prevent it from becoming overheated and, thus, reducing its reliability.

More generally, a temperature sensor is a common feature of complex mixed-signal integrated circuits. A temperature sensor is used to compensate for the sensitivity to temperature of integrated circuits, such as, but not limited to, RF amplifiers and active filters. A particularly challenging problem of a temperature sensor is generating an output that is accurate in absolute terms from part to part such that no calibration of the sensor itself is required. Typically, the absolute accuracy of a sensor is limited by the stability of process parameters and by circuit imperfections, such as amplifier input offset originating from device mismatch. There exists a need, therefore, for circuitry and a method therefor for providing more accurate temperature sensing.

SUMMARY OF THE INVENTION

The invention generally includes generating a PTAT (proportional-to-absolute-temperature) signal with high absolute accuracy without impairment from device mismatch using mixed-signal circuitry (a combination of analog and digital hardware). When a different current is passed through the same diode, or likewise the same current but a different diode area, there will be a difference in current density that can be measured as a difference in voltage. This difference in voltage ($\Delta V_D$) is equal to the quantity $V_T$ times the natural logarithm of the quotient of the current densities.

$$\Delta V_D = V_T \cdot \ln\left(\frac{I_{S1}}{I_{S2}}\right)$$

In the case of an integrated circuit where the same diode is used with different currents or the same current is switched into different diodes, the second term becomes a constant and the value $\Delta V_D$ is equal to a constant times temperature (T). This result is a PTAT (proportional-to-absolute temperature) response.

While there are many ways of generating a PTAT signal in the prior art, including using an analog amplifier to measure the two voltage terms of two diodes at different current densities and performing subtraction and amplification to generate the PTAT, such methods result in error being introduced due to device mismatch. Thus, the present invention includes circuitry and a method that eliminates error from device mismatch. The method and circuitry according to the various embodiments of the proposed invention include a design that facilitates sampling single diode voltage drops based on differing current levels, and feeding the measured voltage drops into a data converter and, finally, performing a temperature computation with digital logic to perform temperature based compensation.

The immunity of the invention to device mismatch impairments provides for a more robust and accurate temperature sensor. Furthermore, the output is more readily utilized in a digital signal processing system as the output is already digitized.

In one embodiment of the invention, a voltage is measured at the cathode of a forward-biased junction diode wherein the voltage level is logarithmically related to the current that passes through it. When a different current is passed through the same diode, or likewise the same current but a different diode area, there will be a difference in current density that can be measured as a difference in voltage. This difference in voltage ($\Delta V_D$) is equal to the quantity $V_T$ times the natural logarithm of the quotient of the current densities.

$$\Delta V_D = V_T \cdot \ln\left(\frac{I_{S1}}{I_{S2}}\right)$$

In the case of an integrated circuit where the same diode is used with different currents or the same current is switched into different diodes, the second term becomes a constant and the value $\Delta V_D$ is equal to a constant times temperature (T). This result is a PTAT (proportional-to-absolute temperature) response.

Previous temperature sensors using analog components are subject to errors arising from device mismatch. For example, if a current density ratio of 16 is used to generate the two diodes' voltages, the resulting difference voltage will be only 26 mV*ln(16) or about 72 mV. This is a difficult quantity to process with an analog amplifier where typical offsets may be on the order of 10-20 mV. The offset of the amplifier will then present an error to the system that will vary from part to part and degrade the accuracy of the measurement irrecoverably. For this reason, the offset of the amplifier is minimized at the potential cost of complexity, die area, and power.

A discrete-time switched-capacitor amplifier can overcome offset issues by sampling and canceling the offset in between sampling and amplifying the diode voltages. This method has proven to be suitable for highly accurate sensors but at the cost of considerable complexity.

The proposed solution here is to digitize the diode voltages with an ADC (analog-to-digital converter) and store the result. The ADC samples the diode voltages at two points in time with different current densities. Digital hardware can then process the difference voltage with arbitrary amplification to limits imposed by the accuracy of the A/D conversion. Since the same sampling mechanism is used, any offset is ideally cancelled in the subtraction operation. A change in current densities can be generated by either switching in additional diode area with a singular current source or additional current with a singular diode or a combination of both.

In one application, a radio frequency (RF) variable gain amplifier (VGA) includes a power amplifier in a direct conversion radio transceiver that includes a gain determination module that reduces an input gain level to the power amplifier (PA) to reduce an output power level of the power amplifier according to temperature indications. In one embodiment of the invention, the gain determination module adjusts input gain levels to compensate for power reduction that occurs as a result of increased temperatures so as to maintain a constant output power level. In another embodiment of the invention, or alternative, in another mode of operation of the invention, the gain determination module reduces the input gain level to the power amplifier to prompt it to produce lower output power so as to cause it to reduce its operational temperature and, therefore, to maintain highest reliability.

In one embodiment of the invention, a baseband processor includes the gain determination module and is coupled to receive the indication of the operating temperature from a temperature sensing module and the indication of the output power of the PA from a power sensing module, respectively. In one aspect of this embodiment of the invention, the baseband processor receives an indication of a user selected mode of operation indicating whether the gain determination module is to adjust the input gain level of the signal produced to the power amplifier to maintain a constant output power level or to adjust the operating temperature to prevent the power amplifier from overheating.

The radio transceiver further includes a plurality of adjustable gain elements that are coupled to receive gain level inputs from the gain determination module to increase or decrease gain level outputs responsive thereto. In one embodiment, the gain determination module generates a signal that is produced to each of the plurality of adjustable gain elements as a gain level input. In an alternate embodiment, the gain determination module generates a plurality of gain level inputs, one for each of the plurality of adjustable gain elements.

Finally, in an alternate embodiment of the invention, a plurality of gain level determination modules is provided. More specifically, a first gain level determination module is coupled to receive a temperature indication from a temperature sensing module while a second gain level determination module is coupled to receive a power level indication from a power level sensing module. Thus, in this embodiment, the first gain level determination module adjusts gain level inputs to the power amplifier to compensate for temperature while the second gain level determination module compensates for output power levels.

Each of the foregoing examples merely illustrates some applications for the present invention. It is understood that the invention is not limited to such embodiments. Other features and advantages of the present invention will become apparent from the following detailed description of the invention made with reference to the accompanying drawings.

DETAILED DESCRIPTION

Figure 1:
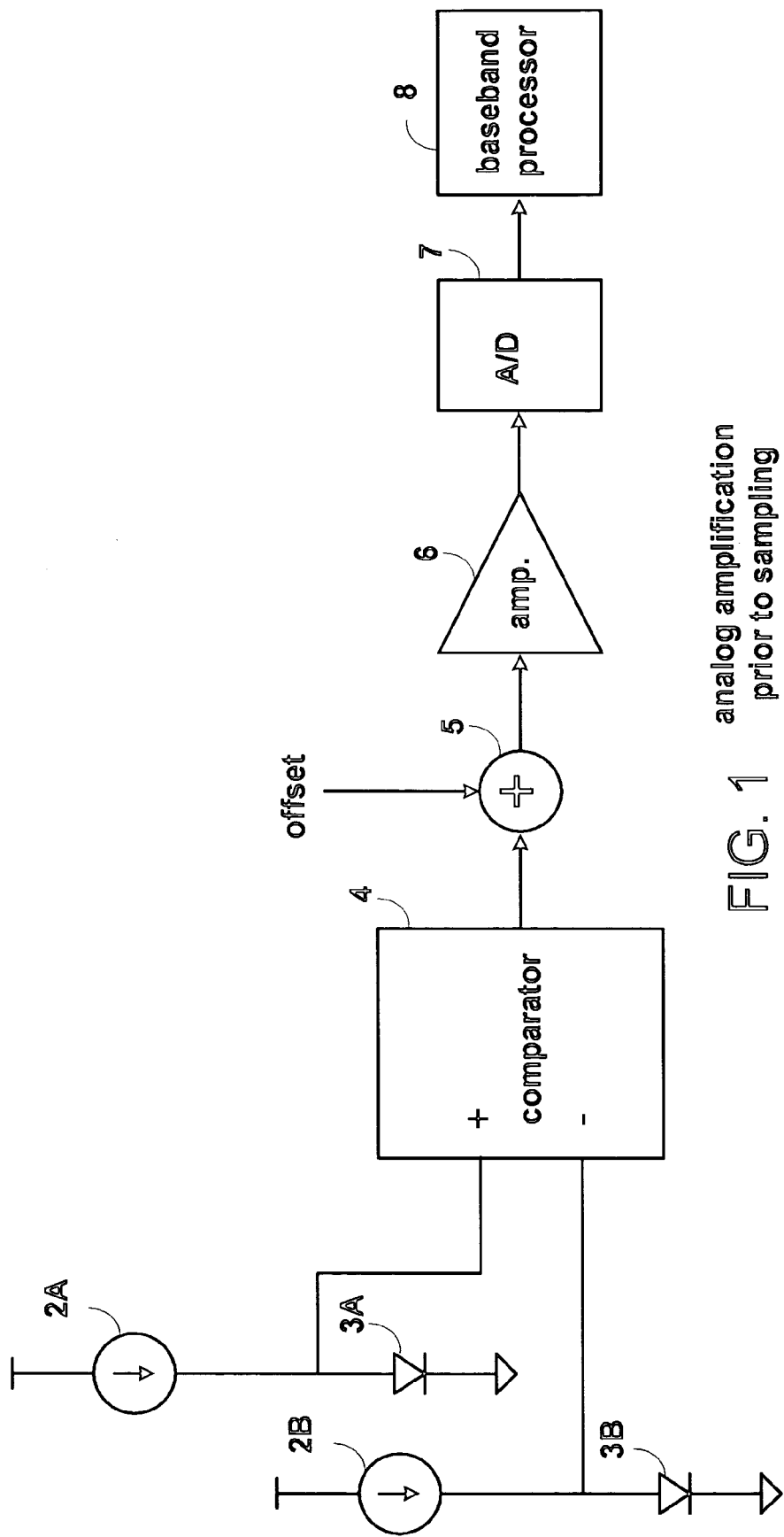
FIG. 1 is a functional schematic block diagram of a temperature sensor with amplification prior to sampling.

FIG. 1 is a functional schematic block diagram of a temperature sensor with amplification prior to sampling. As may be seen, a plurality of current sources 2A and 2B produce a current into diodes 3A and 3B, respectively. Voltage drops across the anode of diodes 3A and 3B are produced to plus (+) and minus (−) inputs of a comparator 4 which produces a difference of the voltage drops to an adder 5 which is further coupled to receive an offset signal. A sum of the offset signal and the difference of the voltage drops is then produced to an amplifier 6. An amplified signal produced by amplifier 6 is then produced to an analog-to-digital converter 7 which produces a digital value reflecting a temperature difference of diodes 3A and 3B. A baseband processor 8 then produces temperature compensation to modify a specified device's operational range based upon the digital value reflecting the temperature difference (and therefore a temperature of the diode 3A or 3B that is being used as a temperature sensor).

Generally, the circuit of FIG. 1 is adequate assuming that devices 3A and 3B are matched. Typically, however, device mismatch from process errors and deviations result in the currents or devices not being perfectly matched thereby reducing the accuracy of the temperature sensing. It is desirable, therefore, to provide a circuit and method for more accurate temperature sensing. For example, if a current density ratio of 16 is used to generate the two diodes' voltages, the resulting difference voltage will be only 26 mV*ln(16) or about 72 mV. This is a difficult quantity to process with an analog amplifier where typical offsets may be on the order of 10-20 mV. The offset of the amplifier will then present an error to the system that will vary from part to part and degrade the accuracy of the measurement irrecoverably. For this reason, the offset of the amplifier is minimized at the potential cost of complexity, die area, and power.

A discrete-time switched-capacitor amplifier can overcome offset issues by sampling and canceling the offset in between sampling and amplifying the diode voltages. This method has proven to be suitable for highly accurate sensors but at the cost of considerable complexity.

Figure 2:
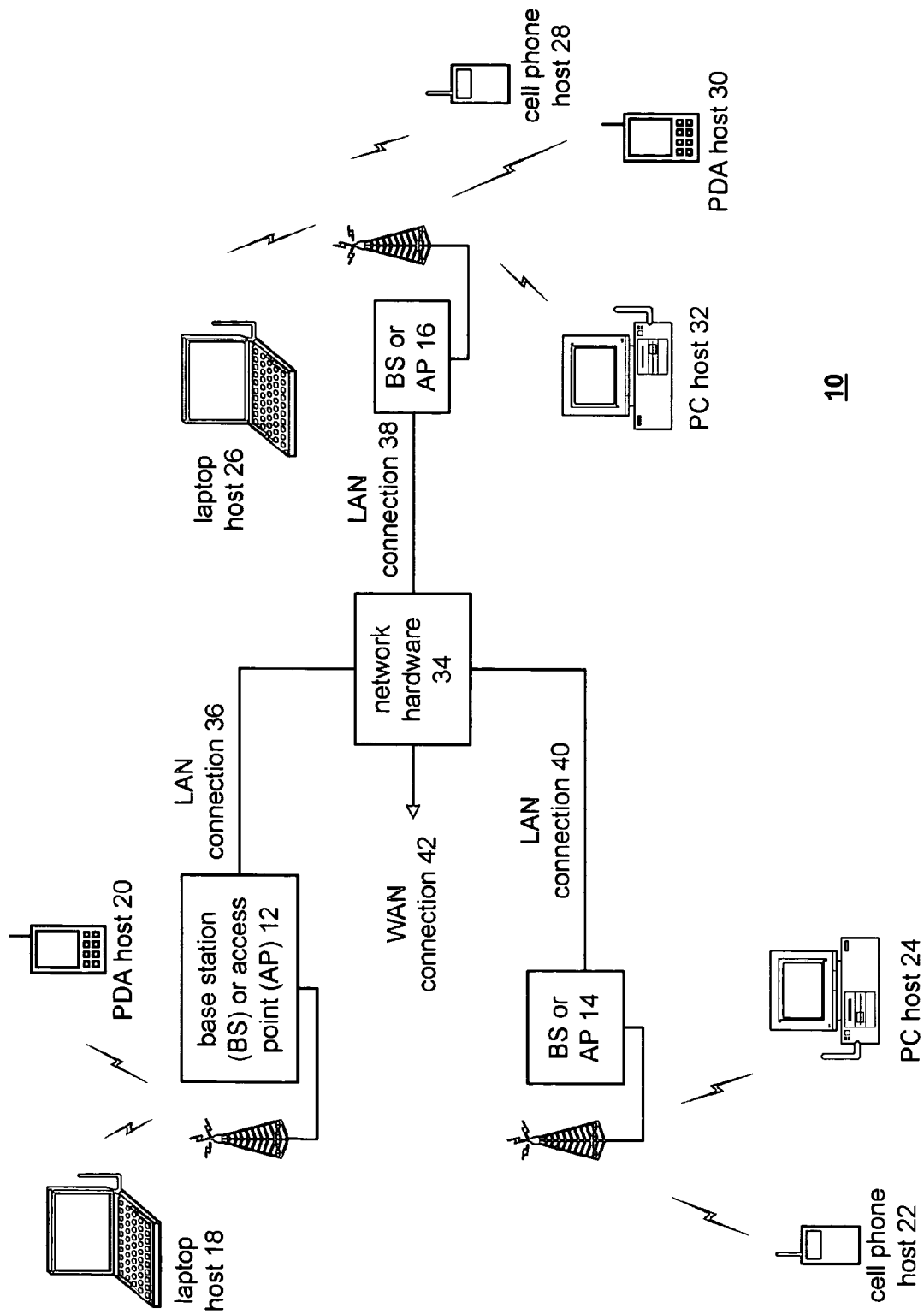
FIG. 2 is a schematic block diagram illustrating a communication system that includes a plurality of base stations and access points, a plurality of wireless communication devices and a network hardware component according to one embodiment of the present invention.

FIG. 2 is a schematic block diagram illustrating a communication system 10 that includes a plurality of base stations and access points 12-16, a plurality of wireless communication devices 18-32 and a network hardware component 34. Any one of the wireless communication devices may include an integrated temperature sensor formed according to an embodiment of the invention. The wireless plurality of communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 3.

The base stations or access points 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the plurality of base stations or access points 12-16 has an associated antenna or antenna array to communicate with the wireless communication devices in its area. Typically, the wireless communication devices register with a particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio may include a highly linear amplifier and/or programmable multi-stage amplifier as disclosed herein to enhance performance, reduce costs, reduce size, and/or enhance broadband applications.

Figure 3:
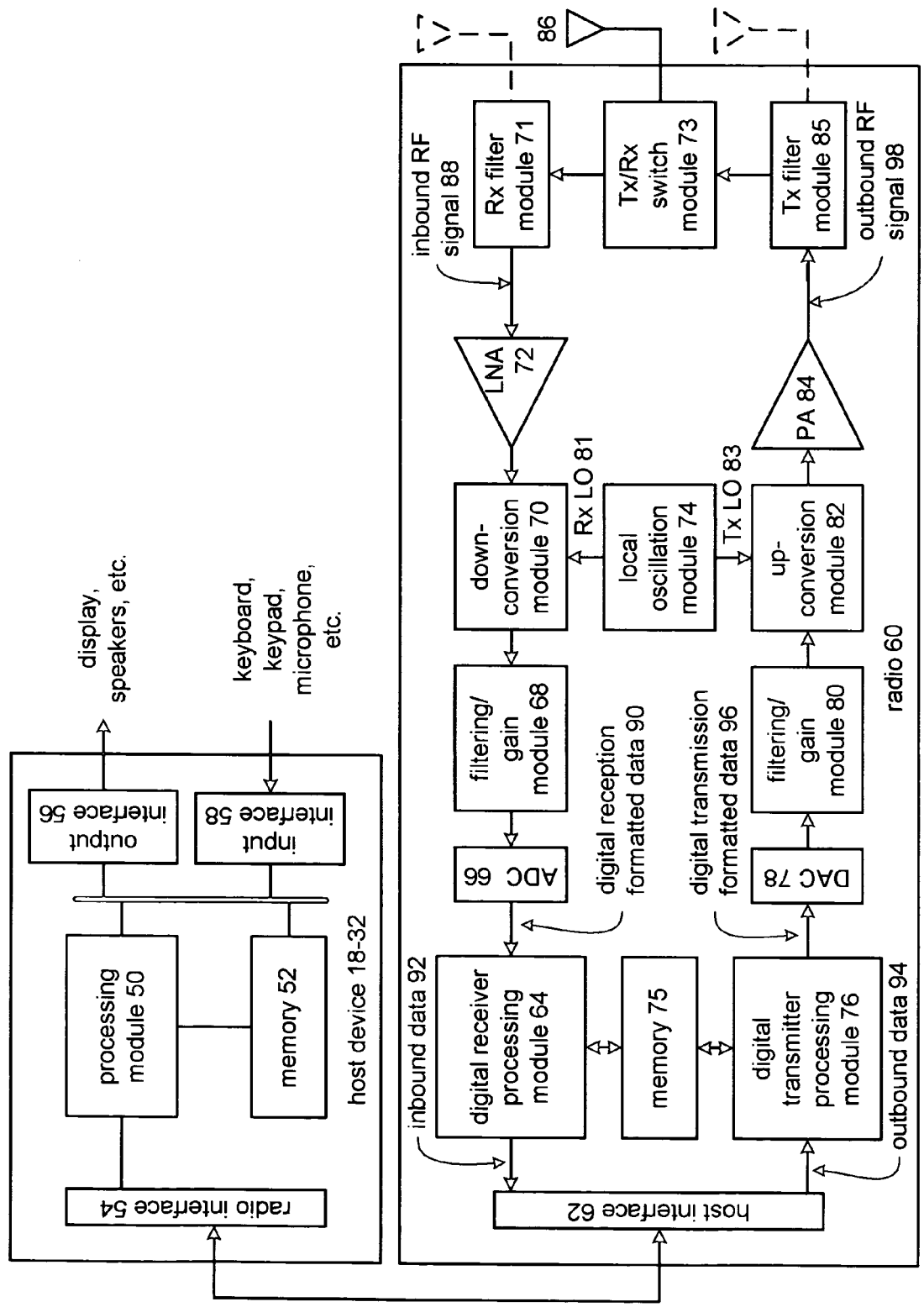
FIG. 3 is a schematic block diagram illustrating a wireless communication device that includes a host device and an associated radio.

FIG. 3 is a schematic block diagram illustrating a wireless communication device that includes the host device 18-32 and an associated radio 60. For cellular telephone hosts, the radio 60 is a built-in component. For personal digital assistant hosts, laptop hosts, and/or personal computer hosts, the radio 60 may be built-in or an externally coupled component.

As illustrated, the host device 18-32 includes a processing module 50, memory 52, a radio interface 54, an input interface 58 and an output interface 56. The processing module 50 and memory 52 execute the corresponding instructions that are typically done by the host device 18-32. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device, such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a receiver filter module 71, a low noise amplifier 72, a transceiver/receiver switch module 73, a local oscillation module 74, memory 75, a digital transmitter processing module 76, a digital-to-analog converter 78, a filtering/gain module 80, an up-conversion module 82, a power amplifier 84, a transceiver filter module 85, and an antenna 86. The antenna 86 may be a single antenna that is shared by the transmit and receive paths as regulated by the transceiver/receiver switch module 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transceiver functions, respectively. The digital receiver functions include, but are not limited to, digital intermediate frequency to baseband conversion, demodulation, constellation demapping, decoding, and/or descrambling. The digital transceiver functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array (FPGA), programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory (ROM), random access memory (RAM), volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated in FIG. 4, et. seq.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF signal typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transceiver local oscillation 83 provided by local oscillation module 74. The power amplifier 84 amplifies the RF signal to produce outbound RF signal 98, which is filtered by the transceiver filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the transceiver/receiver switch module 73, where the receiver filter module 71 bandpass filters the inbound RF signal 88. The receiver filter module 71 provides the filtered RF signal to low noise amplifier 72, which amplifies inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation 81 provided by local oscillation module 74. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one skilled in the art will appreciate, the wireless communication device of FIG. 3 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device 18-32 and the digital receiver and transmitter processing modules 64 and 76 may be a common processing device implemented on a single integrated circuit. Further, memory 52 and memory 75 may be implemented on a single integrated circuit and/or on the same integrated circuit as the common processing modules of processing module 50 and the digital receiver and transmitter processing modules 64 and 76.

Figure 4:
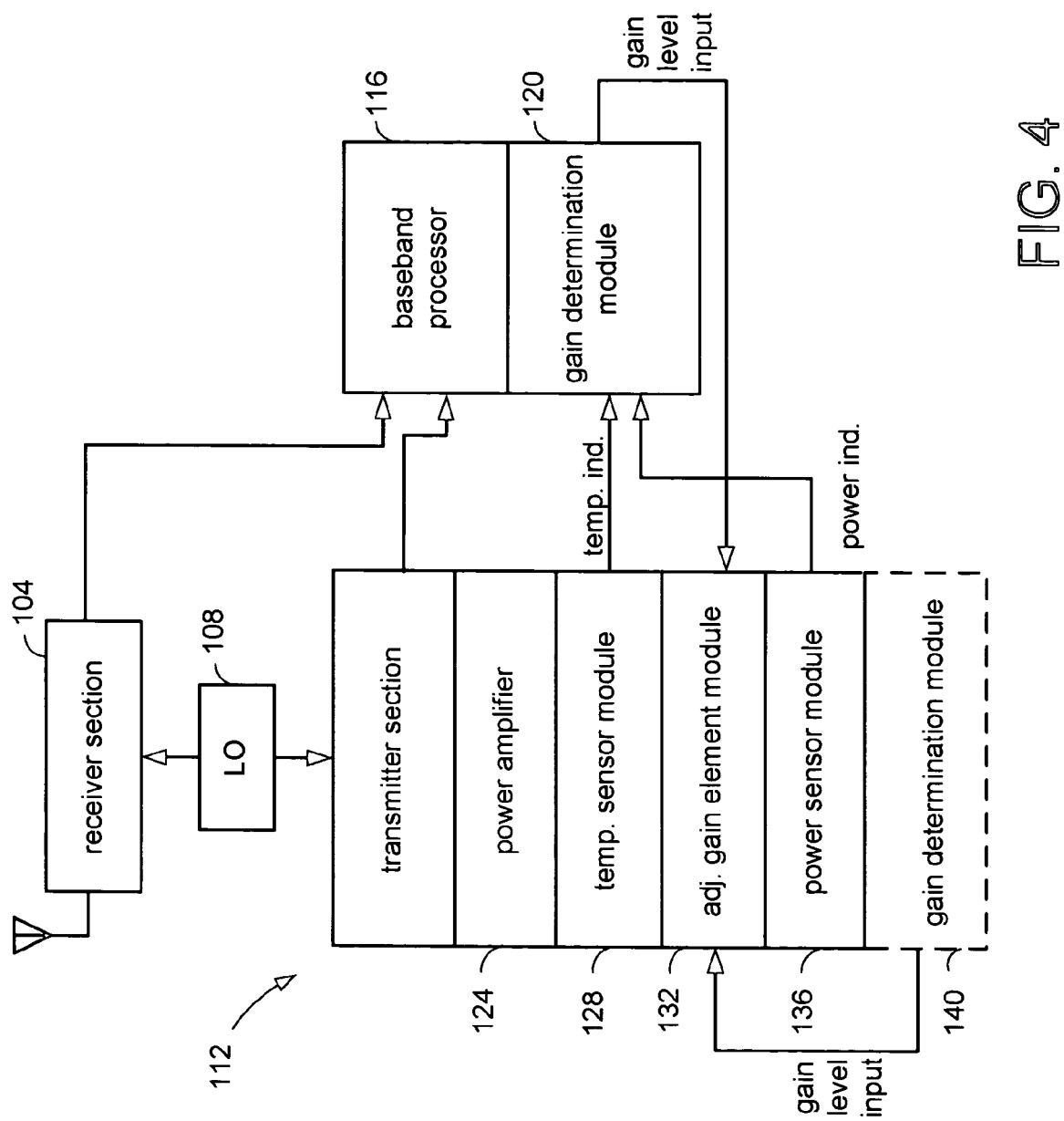
FIG. 4 is a functional block diagram of a radio frequency (RF) transceiver integrated circuit formed according to one embodiment of the present invention.

FIG. 4 is a functional block diagram of a radio frequency (RF) transceiver integrated circuit formed according to one embodiment of the present invention. The RF transceiver includes a receiver section 104 that is coupled to receive a local oscillation from a local oscillator 108. The RF transceiver further includes a transmitter section shown generally at 112 that also is coupled to receive a local oscillation from local oscillator 108. The RF transceiver also includes a baseband processor 116 that further includes a gain determination module 120. Gain determination module 120 is for determining and generating a gain level input that is provided to an adjustable gain element. Gain determination module 120 determines gain based upon at least one of a detected power level and a detected temperature. The detected temperature may be, for example, a temperature of a power amplifier.

Transmitter section 112 includes a power amplifier 124, a temperature sensor module 128, an adjustable gain element module 132 and a power sensor module 136. In one embodiment of the invention, transmitter section 112 optionally includes a gain determination module 140, while baseband processor 116 does not include the gain determination module 120. In yet another embodiment of the invention, both transmitter section 112 and baseband processor 116 include the gain determination modules 140 and 120, respectively. Additionally, any one of the power sensor module 136 or temperature sensor module 128 may be removed from transmitter section 112 and implemented as a separate circuit. In this embodiment, gain determination module 120 would attempt to adjust the gain of the adjustable gain element module 132 according to the module input received from transmitter section 112, while gain determination module 140 would continue to determine a gain level for the adjustable gain element module 132 for the remaining temperature sensor module 128 or power sensor module 136, respectively.

In operation, one of two modes may be selected. In a first mode, the transmitter section 112 attempts to maintain a constant output power level. Accordingly, power sensor module 136, in the embodiment of FIG. 4, monitors an output power level of power amplifier 124 and generates power level indications to gain determination module 140 (and in one embodiment, also to the gain determination module 120). The gain determination module(s) 140 and/or 120 then generate gain level input signals to adjustable gain element module 132 to increase or decrease its gain level output, thereby increasing or decreasing the output power level of power amplifier 124. In a second mode of operation, the transmitter section 112 does not attempt to maintain a constant output power level from power amplifier 124. Rather, it attempts to maintain the transistor(s) of the power amplifier 124 in a reliable region of operation.

In the second mode of operation, temperature sensor module 128 determines a temperature of power amplifier 124 and generates an indication of the detected temperature to the gain determination modules 140 and/or 120. Gain determination modules 140 and/or 120 therefore generate gain level input to adjustable gain element module 132 to increase or decrease the corresponding gain level output to increase or decrease the output power level of the power amplifier 124. For example, if the temperature sensor module 128 indicates that the power amplifier 124 is hot and has a temperature that exceeds a specified threshold, which specified threshold is selected to keep the transistor of the power amplifier 124 within the reliable region, the gain determination modules 140 and/or 120 will generate gain level inputs to adjustable gain element module 132 to reduce its gain level output, thereby reducing the output power level of power amplifier 124 to reduce its operating temperature to keep the highest reliability.

Figure 5:
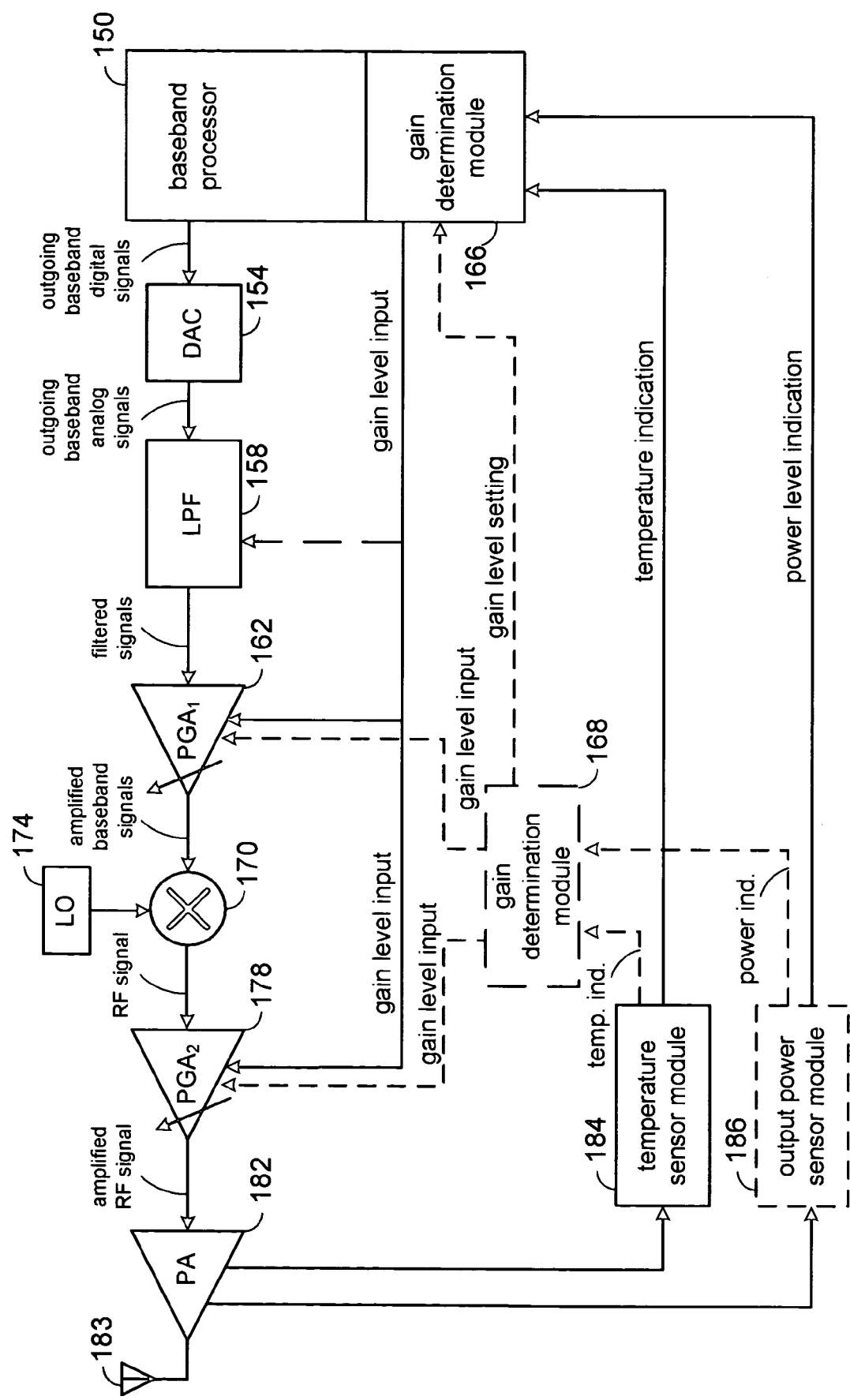
FIG. 5 is a functional schematic block diagram illustrating one embodiment of the present invention.

FIG. 5 is a functional schematic block diagram illustrating one embodiment of the present invention. A baseband processor 150 is coupled to produce outgoing baseband digital signals to a digital-to-analog converter module 154 that converts the outgoing digital baseband signals to outgoing (continuous waveform) baseband analog signals. The outgoing baseband analog signals are produced from the digital-to-analog converter module 154 to low pass filter 158. In the described embodiment of the invention, low pass filter 158 not only provides specified filtering, but also provides amplification at a fixed gain level. In an alternate embodiment of the invention, however, low pass filter 158 provides the variable amplification level. Low pass filter 158 generates filtered signals to a first programmable gain amplifier 162.

Programmable gain amplifier 162 is coupled to receive the filtered signals and to provide a specified amount of gain responsive to a received gain level input. In the described embodiment of the invention, the received gain level input is generated by a gain determination module 166 within baseband processor 150. In an alternate embodiment of the invention, the gain level input is generated by a gain determination module 168 that is external to baseband processor 150. In yet another embodiment, both gain determination modules 168 and 166 generate gain level inputs that are jointly provided to some or all of the variable gain amplification devices. Programmable gain amplifier 162, responsive to receiving one or more gain level inputs, provides an amplified baseband signal to a mixer 170. Mixer 170 further is coupled to receive a local oscillation from a local oscillator 174 to up-convert the amplified baseband signal received from programmable gain amplifier 162. Mixer 170 produces a radio frequency signal that is produced to a second programmable gain amplifier 178. Programmable gain amplifier 178 then provides a specified amount of amplification responsive to a received gain level input. As before, the received gain level input is generated by gain determination module 166 within baseband processor 150 or by gain determination module 168. In one embodiment of the invention, programmable gain amplifiers 178 and 162 receive the same gain level input generated by gain determination modules 166 and 168. In an alternate embodiment of the invention, gain determination modules 166 and 168 generate separate gain level inputs for programmable gain amplifiers 162 and 178, respectively.

Programmable gain amplifier 178 then provides an amplified RF signal to a power amplifier 182. Power amplifier 182 then further amplifies the amplified RF signal received from programmable gain amplifier 178 to a specified output power level. The output of power amplifier 182 is then produced to an antenna 183 where it is radiated outwardly.

A temperature sensor module 184 is placed proximate to power amplifier 182 so that it is thermodynamically coupled to power amplifier 182. Accordingly, temperature sensor module 184 is able to monitor and detect a temperature of power amplifier 182 and to produce a temperature indication to gain determination module 166 of baseband processor 150 (or to gain determination module 168). An optional output power sensor module 186 is coupled to detect an output power level of power amplifier 182. Output power sensor module 186 generates an indication of the output power level of power amplifier 182 to gain determination module 166. Gain determination module 166 is operable to determine and generate gain level input signals to programmable gain amplifiers 162 and 178 according to the received temperature indication and the received power level indication.

In one embodiment of the invention, gain determination module 166 generates the gain level inputs responsive to only one of either the temperature indication or the power level indication, but not both. Baseband processor 150, in this embodiment, receives a gain determination mode input, as selected by a user, to determine whether it generates gain level inputs according to the temperature indication or the power level indication. In an alternate embodiment of the invention, gain determination module 166 generates gain level inputs responsive to both the temperature indication and the power level indication. In yet another embodiment of the present invention, gain determination module 166 includes computer instructions that are executed by baseband processor 150 to execute the logic for defining the gain level inputs. Accordingly, a user specifies whether the gain determination module 166 (or gain determination module 168 in an alternate embodiment of the invention) responds to temperature indications or power level indications by downloading a corresponding set of computer instructions to achieve the desired operation.

Figure 6:
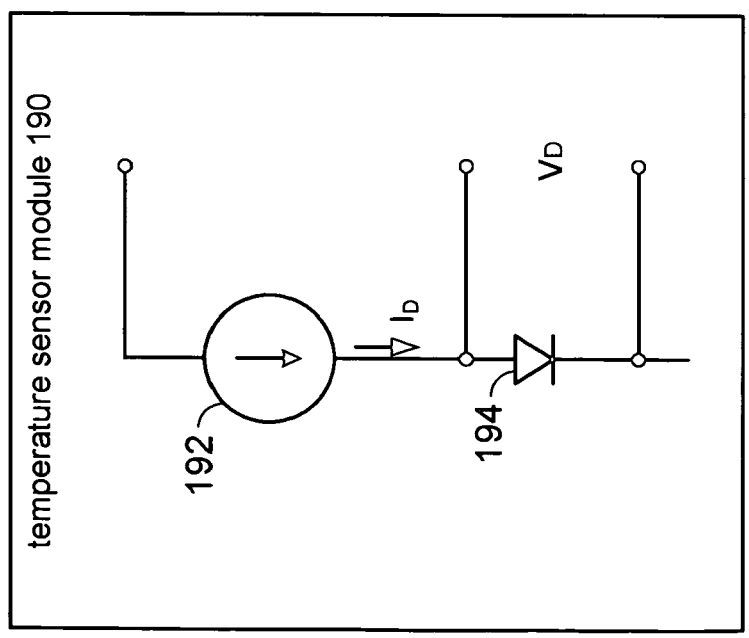
FIG. 6 is a schematic block diagram of a temperature sensor module according to one aspect of the present invention.

FIG. 6 is a schematic diagram illustrating one exemplary aspect of the present invention of a temperature sensor module 190. Temperature sensor module 190 includes a constant current source 192 that produces a current $I_D$. Current $I_D$ generated by current source 192 is produced to the input of a diode 194. For room temperature operation, a constant current $I_D$ will generate a voltage drop across diode 194 equal to $V_D$. As the temperature of diode 194 increases, however, the voltage across diode 194 will decrease for a constant current $I_O$. Accordingly, one aspect of the present invention includes determining a change in current to determine a corresponding temperature or temperature change.

The current $I_D$ that is generated by current source 192 and that is conducted through diode 194 may be expressed as:

$$I_D = I_S \cdot e^{\frac{V_D}{V_T}}$$

Thus, as may be seen, an inverse relationship exists between current flow in the diode and temperature. In one embodiment of the invention, a voltage is measured at the cathode of a forward-biased junction diode that is logarithmically related to the current that passes through it. When a different current is passed through the same diode, or likewise the same current but a different diode area, there will be a difference in current density that can be measured as a difference in voltage. This difference in voltage ($\Delta V_D$) is equal to the quantity $V_T$ times the natural logarithm of the quotient of the current densities and may be expressed as:

$$\Delta V_D = V_T \cdot \ln\left(\frac{I_{S1}}{I_{S2}}\right)$$

In the case of an integrated circuit where the same diode is used with different currents or the same current is switched into different diodes, the second term becomes a constant and the value $\Delta V_D$ is equal to a constant times temperature (T). This result is a PTAT (proportional-to-absolute temperature) response. Thus, $$V_D = V_T \cdot \ln\left(\frac{I_D}{I_S}\right)$$

$$V_T = \frac{k \cdot T}{q} = \frac{26\,mV}{300K} \cdot T$$

$$I_S = A_D q n_i^2 \left(\frac{D_n}{L_n N_A} + \frac{D_p}{L_p N_D}\right)$$

Figure 7:
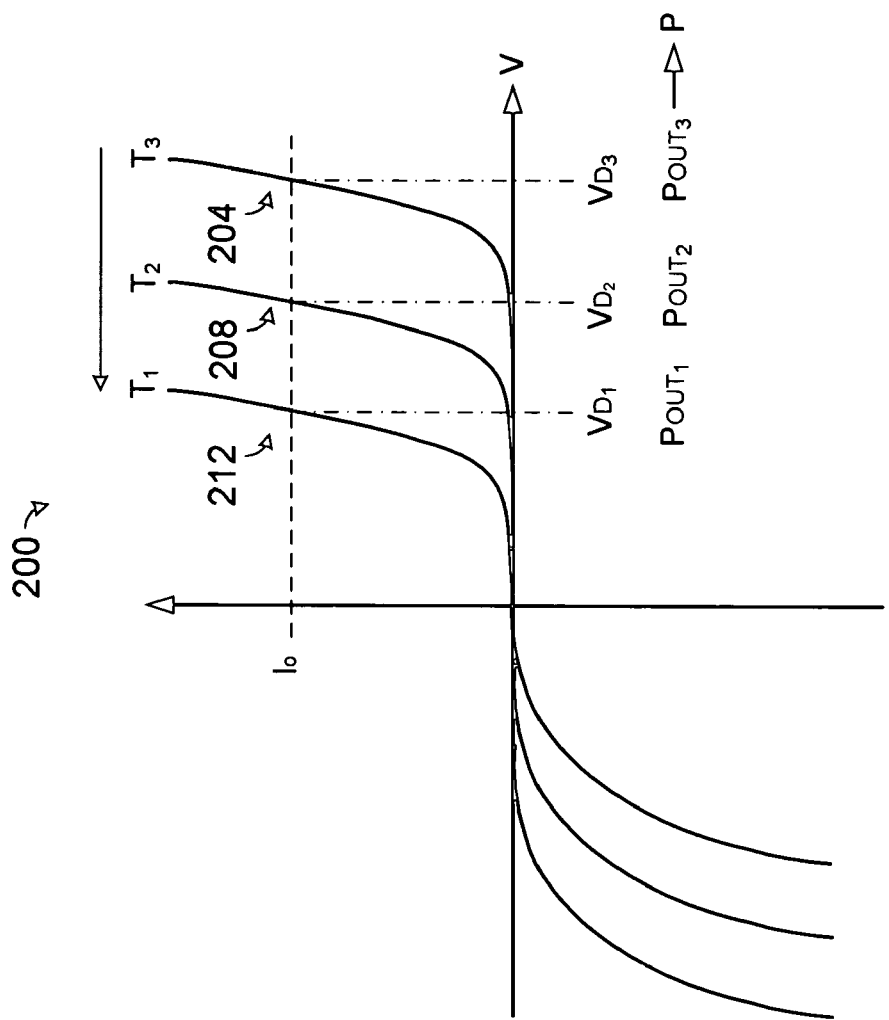
FIG. 7 is a set of curves illustrating the relationship between a constant current $I_O$, temperature and a voltage drop across a diode.

FIG. 7 is a set of curves illustrating the relationship between a constant current $I_D$, temperature and a voltage drop across a diode. More specifically, the set of temperature and voltage response curves 200 of FIG. 7 show, for a constant current $I_O$, that the voltage $V_D$ drops according to the temperature T. Thus, for a temperature $T_3$, a corresponding voltage of $V_{D3}$ is shown at 204. Similarly, a voltage drop of $V_{D2}$ is shown for an increased temperature $T_2$ (relative to $T_3$) at 208 and the voltage drop $V_{D1}$ is shown for an increased temperature $T_1$ (relative to $T_2$) at 212. As is further shown in FIG. 7, the temperature $T_1$ is higher in magnitude than the temperatures $T_2$ and $T_3$. Similarly, the voltage drop $V_{D3}$ is higher than the voltage drops $V_{D2}$ and $V_{D1}$. Corresponding output power levels $P_{OUT1}$, $P_{OUT2}$ and $P_{OUT3}$ are shown to correspond with voltage drops $V_{D1}$, $V_{D2}$ and $V_{D3}$, respectively wherein $P_{OUT3} > P_{OUT2} > P_{OUT1}$.

Figure 8:
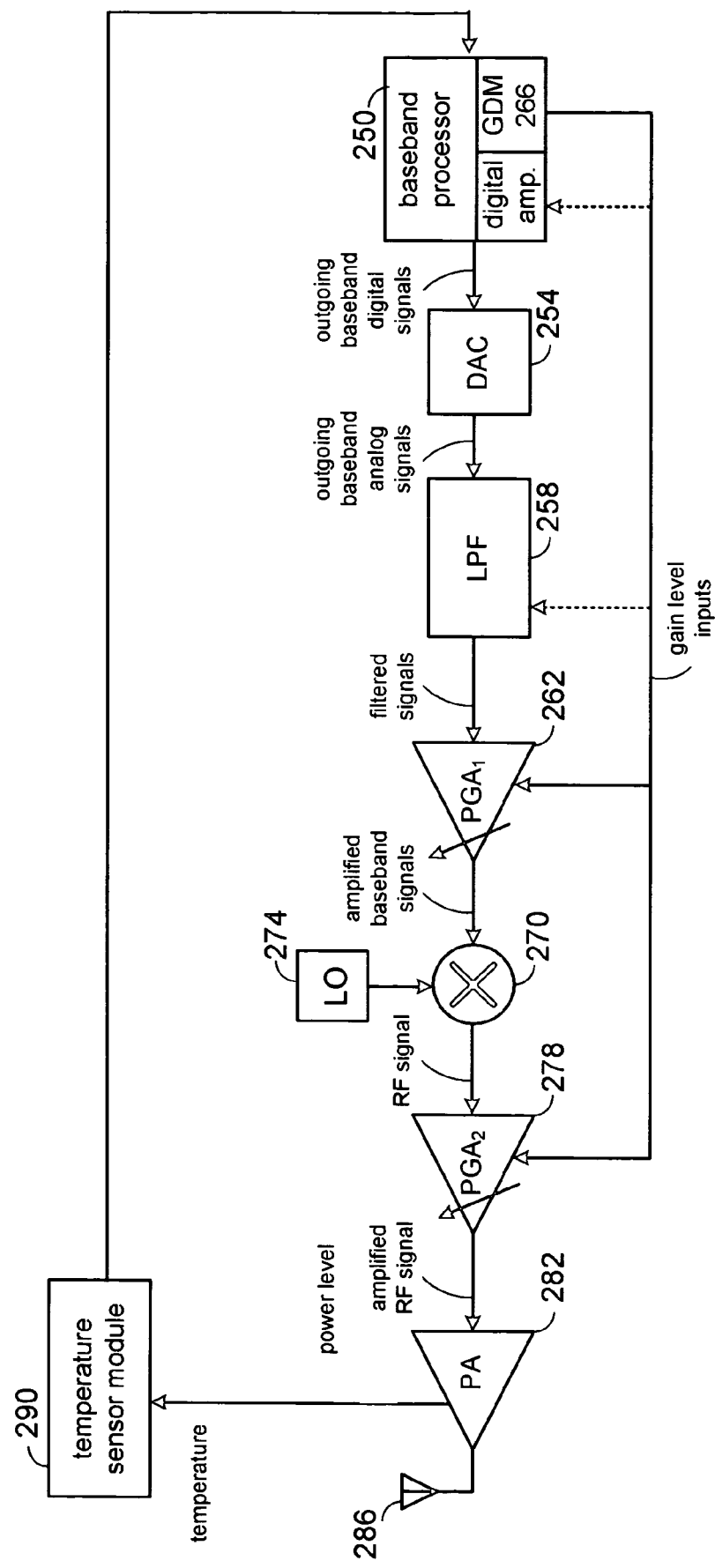
FIG. 8 is a functional schematic block diagram illustrating one embodiment of the present invention.

FIG. 8 is a functional schematic block diagram illustrating one embodiment of the present invention. A baseband processor 250 provides outgoing baseband digital signals to a digital-to-analog converter module 254 that converts the outgoing baseband digital signals to outgoing baseband analog signals. The outgoing baseband analog signals are provided to low pass filter 258. In the described embodiment of the invention, low pass filter 258 not only provides specified filtering, but also provides amplification at a certain gain level. In an alternate embodiment of the invention, however, low pass filter 258 provides a variable amplification level. Low pass filter 258 generates filtered signals to a first programmable gain amplifier (adjustable gain element) 262. Programmable gain amplifier 262 is coupled to receive the filtered signals and to provide a specified amount of gain responsive to a received gain level input. In the described embodiment of the invention, the received gain level input is generated by a gain determination module 266 within baseband processor 250.

Programmable gain amplifier 262 then provides amplified baseband signals to a mixer 270. Mixer 270 further is coupled to receive a local oscillation from a local oscillator 274 to up-convert the amplified baseband signals received from programmable gain amplifier 262. Mixer 270 produces a radio frequency signal that is produced to a second programmable gain amplifier 278. Programmable gain amplifier 278 then provides a specified amount of amplification responsive to a received gain level input. As previously mentioned, the received gain level input is generated by gain determination module 266 within baseband processor 250.

In one embodiment of the invention, programmable gain amplifiers 262 and 278 receive the same gain level inputs generated by gain determination module 266. In an alternate embodiment of the invention, gain determination module 266 generates separate gain level inputs for each of the programmable gain amplifiers 262 and 278, respectively. Programmable gain amplifier 278 then provides an amplified RF signal to a power amplifier 282. Power amplifier 282 then amplifies the amplified RF signal received from programmable gain amplifier 278 to a corresponding output power level that is a function of the amplified RF signal gain level produced by programmable gain amplifier 278. The output of power amplifier 282 is then produced to an antenna 286 where it is radiated outwardly.

A temperature sensor module 290 is placed proximate to power amplifier 282 so that it is thermodynamically coupled to power amplifier 282. Accordingly, temperature sensor module 290 is able to monitor and detect a temperature of power amplifier 282 and to produce a temperature indication to gain determination module 266 of baseband processor 250. Gain determination module 266 is operable to determine and generate gain level input signals to programmable gain amplifiers 262 and 278 according to the received temperature indication. Baseband processor 250, in this embodiment, receives a gain determination mode input, as selected by a user, to determine whether it generates gain level inputs according to the temperature indication or the power level indication.

In an alternate embodiment of the invention, gain determination module 266 generates gain level inputs responsive to both the temperature indication and the power level indication. In yet another embodiment of the present invention, gain determination module 266 includes computer instructions that are executed by baseband processor 250 to execute the logic for defining the gain level inputs. Accordingly, a user specifies whether the gain determination module 266 responds to temperature indications or power level indications by downloading a corresponding set of computer instructions to achieve the desired operation. As may also be seen, gain determination module 266 further generates an internal gain level input to a digital amplifier formed within baseband processor 250.

Figure 9:
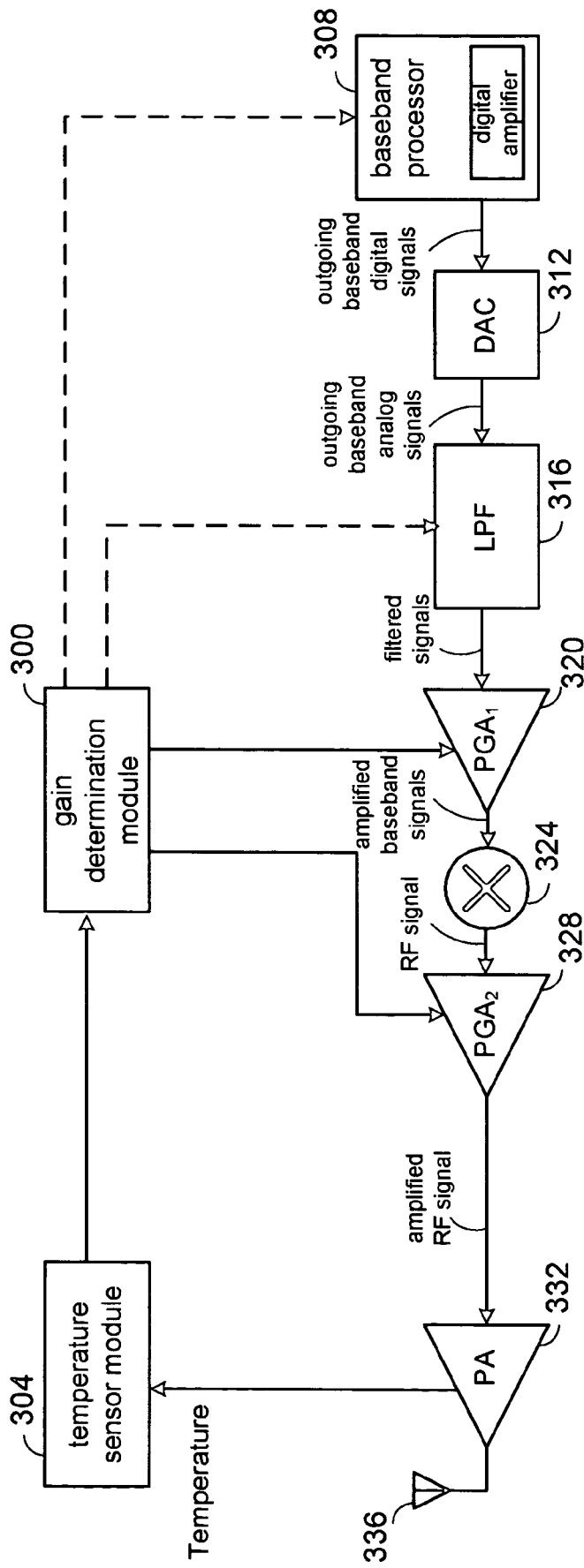
FIG. 9 is a functional schematic block diagram illustrating an alternative embodiment of the present invention.

FIG. 9 is a functional schematic block diagram illustrating an alternative embodiment of the present invention. A gain determination module 300 is coupled to receive an indication of a temperature from a temperature sensor module 304. A baseband processor 308 is coupled to produce outgoing baseband digital signals to a digital-to-analog converter module 312 that converts the outgoing baseband digital signals to outgoing baseband analog (continuous waveform) signals. The outgoing baseband analog signals are produced from digital-to-analog converter module 312 to low pass filter 316. In the described embodiment of the invention, low pass filter 316 not only provides specified filtering, but also provides amplification at a fixed gain level.

In an alternate embodiment of the invention, however, low pass filter 316 provides a variable gain level. Low pass filter 316 provides filtered signals to a first programmable gain amplifier 320. Programmable gain amplifier 320 is coupled to receive the filtered signals and to provide a specified amount of gain responsive to a received gain level input received from gain determination module 300.

Programmable gain amplifier 320 then provides amplified baseband signals to a mixer 324. Mixer 324 further is coupled to receive a local oscillation from a local oscillator (not shown in FIG. 9) to up-convert the amplified baseband signals received from programmable gain amplifier 320. Mixer 324 produces a radio frequency signal that is produced to a second programmable gain amplifier 328. Programmable gain amplifier 328 then provides a specified amount of amplification responsive to a received gain level input.

Programmable gain amplifier 328 then generates an amplified RF signal to a power amplifier 332. Power amplifier 332 then amplifies the amplified RF signal received from programmable gain amplifier 328 to a specified output power level. The output of power amplifier 332 is then produced to an antenna 336 where it is radiated outwardly.

Temperature sensor module 304 is placed proximate to power amplifier 332 so that it is thermodynamically coupled to power amplifier 332. Accordingly, temperature sensor module 304 is able to monitor and detect a temperature of power amplifier 332 and to produce a temperature indication to gain determination module 300.

The embodiment as shown in FIG. 9 is similar to that of FIG. 8, with some differences. Gain determination module 266 of the baseband processor of FIG. 8 has been replaced by a gain determination module 300 that is formed in hardware external to the baseband processor. Accordingly, temperature sensor module 304 generates the temperature indication and produces it to gain determination module 300. Gain determination module 300 then generates gain level inputs to programmable gain amplifiers 320 and 328. Additionally, in one embodiment of the invention, gain determination module 300 generates gain level inputs to baseband processor 308 to prompt an internal digital amplifier to adjust its gain level output accordingly. In an alternate embodiment of the invention, gain determination module 300 further generates gain level inputs to low pass filter 316. Finally, gain determination module 300 generates gain level inputs that are produced to baseband processor 308 to prompt it (or, more specifically, to prompt the digital amplifier there within) to increase or decrease the digital gain of its outgoing digital baseband signals.

Figure 10:
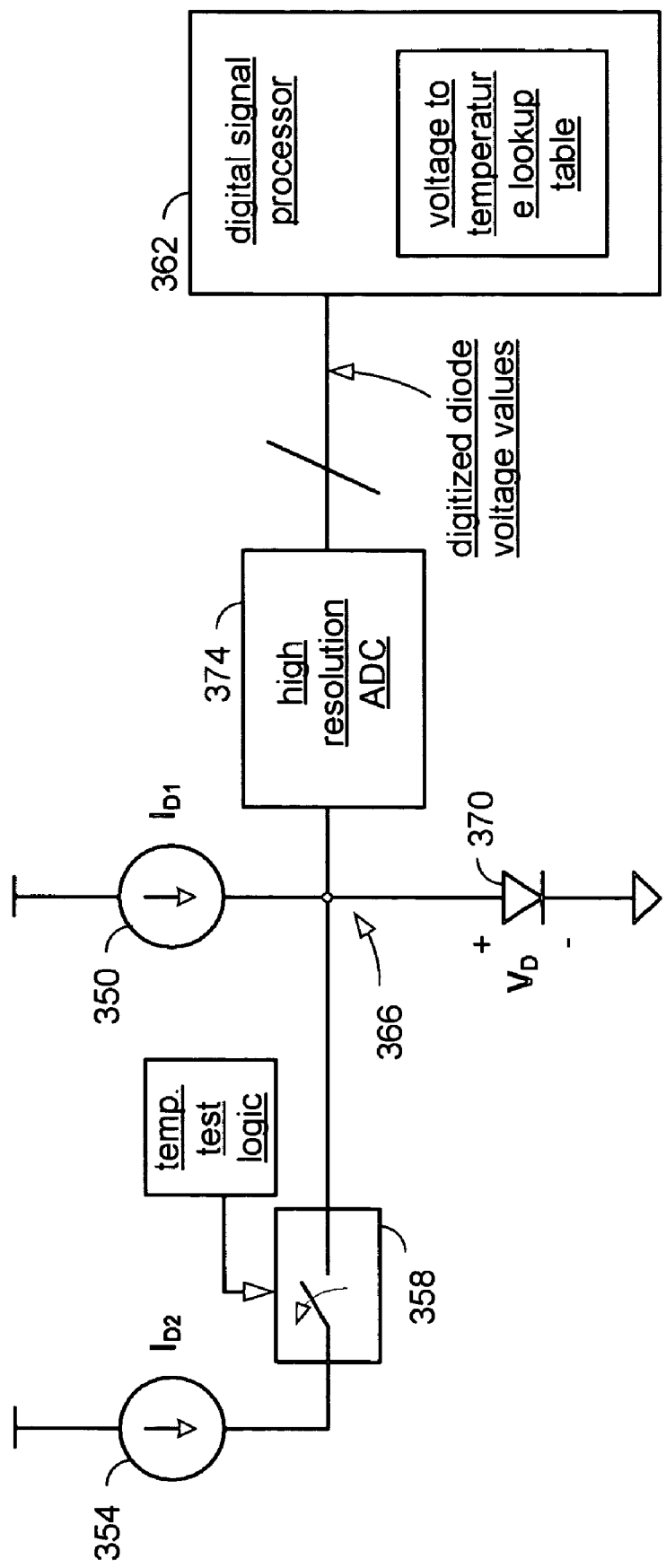
FIG. 10 is a functional schematic block diagram of a temperature sensor according to one embodiment of the present invention.

FIG. 10 is a functional schematic block diagram of a temperature sensor according to one embodiment of the present invention. The PTAT temperature sensor of FIG. 10 includes a plurality of current sources, shown here as current sources 350 and 354. While only two current sources are shown, the embodiments of the present invention may readily include more than two current sources. In the described embodiment of the invention, current source 354 produces eight times the current of current source 350. Stated differently, $I_{D2}=8\,I_{D1}$ in the described embodiment of FIG. 10.

Current source 354 is coupled to a switch 358 that is selectively opened and closed by temporary test logic which, in the described embodiment, is formed within digital signal processor 362 by computer instructions executed by digital signal processor 362. The temporary test logic may also be formed in hardware. Whenever switch 358 is closed, both current sources 350 and 354 source current into node 366 and through diode 370. As described above, current through diode 370 is a function of temperature. Thus, a voltage drop across the diode also is a function of temperature. Thus, the voltage drop $V_D$ is produced to a high resolution analog-to-digital converter (ADC) 374 from node 366. In the described embodiment of the invention, ADC 374 is a 16-bit high resolution ADC to provide adequate resolution and voltage response range. Thus, ADC 374 produces digitized diode voltage drops $V_D$ to digital signal processor 362 where the digitized voltage values are stored. As will be described below, the voltage drops $V_D$ are measured for current provided solely from current source 350 and from current provided by both current sources 350 and 354. Accordingly, because the voltage drop $V_D$ results from the same diode, offsets due to fabrication errors are avoided. The process of taking such measurements is periodically repeated to facilitate detecting actual changes in voltage due to temperature. Thus, temperature changes may accurately be detected. In the described embodiment, diode 370 is a diode-configured transistor. Thus, the voltage across diode 370 is a voltage across the base and the emitter if a bipolar junction transistor is utilized. A generic reference to this voltage is merely $V_D$.

In operation, the ADC samples the diode voltages at two points in time with different current densities. Digital hardware can then process the difference voltage with arbitrary amplification to limits imposed by the accuracy of the A/D conversion. Since the same sampling mechanism is used, any offset is ideally cancelled in the subtraction operation. A change in current densities can be generated by either switching in additional diode area with a singular current source or additional current with a singular diode or a combination of both.

Figure 11:
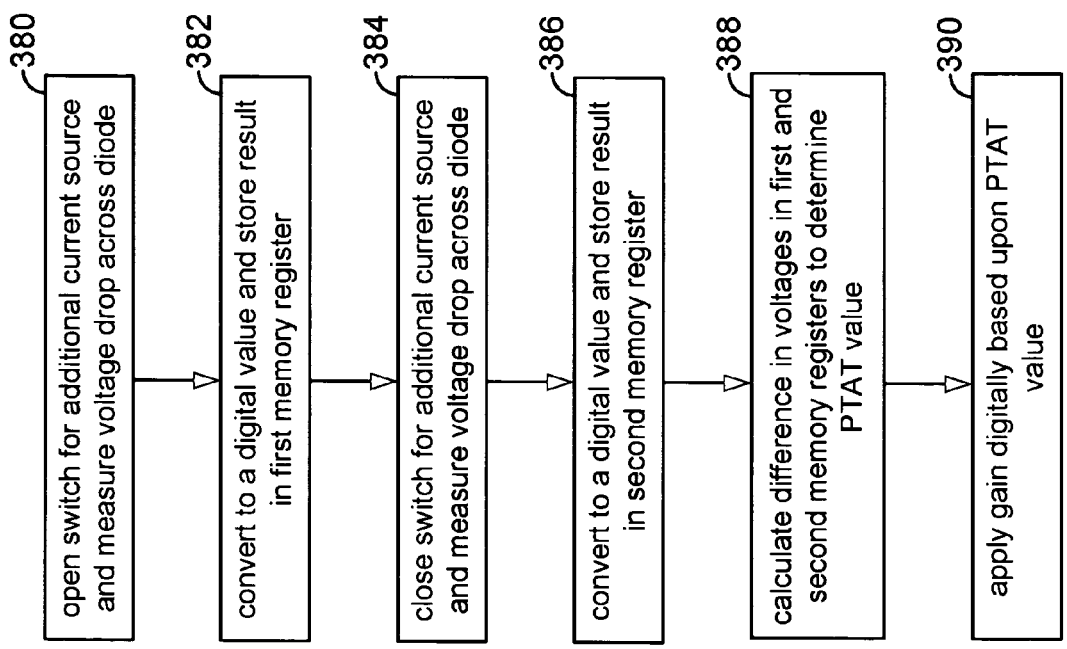
FIG. 11 is a flowchart illustrating a method according to one embodiment of the present invention.

FIG. 11 is a flowchart illustrating a method according to one embodiment of the present invention. The method of FIG. 11 may readily be understood if compared to the embodiment shown in FIG. 10. Initially, the method includes opening a switch that selectively couples an additional current source and measuring a voltage drop across a diode or other semiconductor device having temperature sensitive operating characteristics (step 380). Thereafter, the method includes converting the measured voltage to a digital value and storing the result in a first memory register (step 382). Presuming linear relationship between temperature and current, a next step of the invention includes increasing current while the device is operating at a temperature for the first measurement. Thus, the next step is to close the switch for the additional current source to increase the current and to measure the voltage drop across a diode or semiconductor device (step 384) and to convert the measured result to a digital value and to store the result in a second memory register (step 386). Once the results are stored in the first and second memory registers, the method according to the described embodiment includes calculating a difference of the voltage values in the first and second memory registers and determining a PTAT value (step 388). Thereafter, the method includes applying a gain digitally based upon the PTAT value (step 390).

Figure 12:
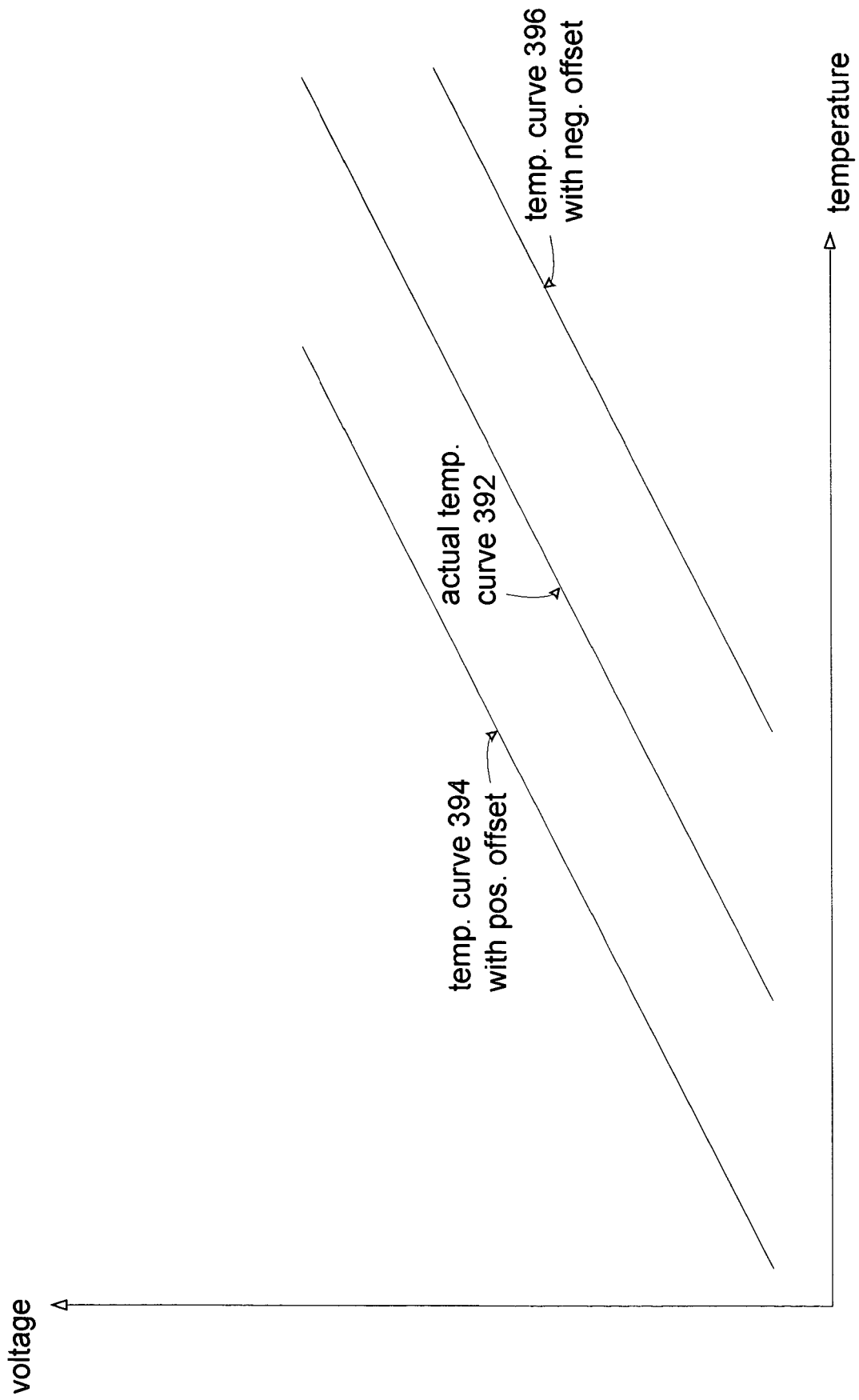
FIG. 12 is a diagram illustrating operation of a temperature sensor according to one embodiment of the invention.

FIG. 12 is a diagram illustrating operation of a temperature sensor according to one embodiment of the invention. Referring to FIG. 12, a temperature curve 392 represents an actual temperature/voltage curve for a typical semiconductor device. Generally, a linear relationship exists between voltage and temperature, as illustrated by temperature curve 392. Typically, however, offset voltages, differences in device characteristics from device fabrication, and other influences, can shift a voltage/temperature curve in either horizontal direction, as shown in FIG. 12. In one described embodiment of the invention, a single device is used to measure temperature difference with a plurality of current sources wherein at least one current source is switched in and out of coupling to make the temperature measurements. In that embodiment, any offset is carried through to the DSP (???) and is subtracted as the temperature changes are determined. Further, because only one device is used as a temperature sensor, no offsets are introduced due to device mismatch. Thus, a plotted temperature/voltage curve is not shifted due to offset problems. That embodiment, however, requires a high resolution analog-to-digital converter.

An alternate embodiment of the invention includes a plurality of devices that are used for temperature detection but includes circuitry and a method for removing offset shifts from a temperature/voltage curve. Referring again to FIG. 12, the method according to the alternate embodiment of the invention includes generating a temperature/voltage curve with an opposite offset so as to produce an actual temperature/voltage curve such as curve 392. As may further be seen, temperature/voltage curves 394 and 396 are shown with positive and negative offsets are shown, respectively. As will be further explained below, actual temperature curve 392 may be derived from evaluating the difference in curves 394 and 396.

Figure 13:
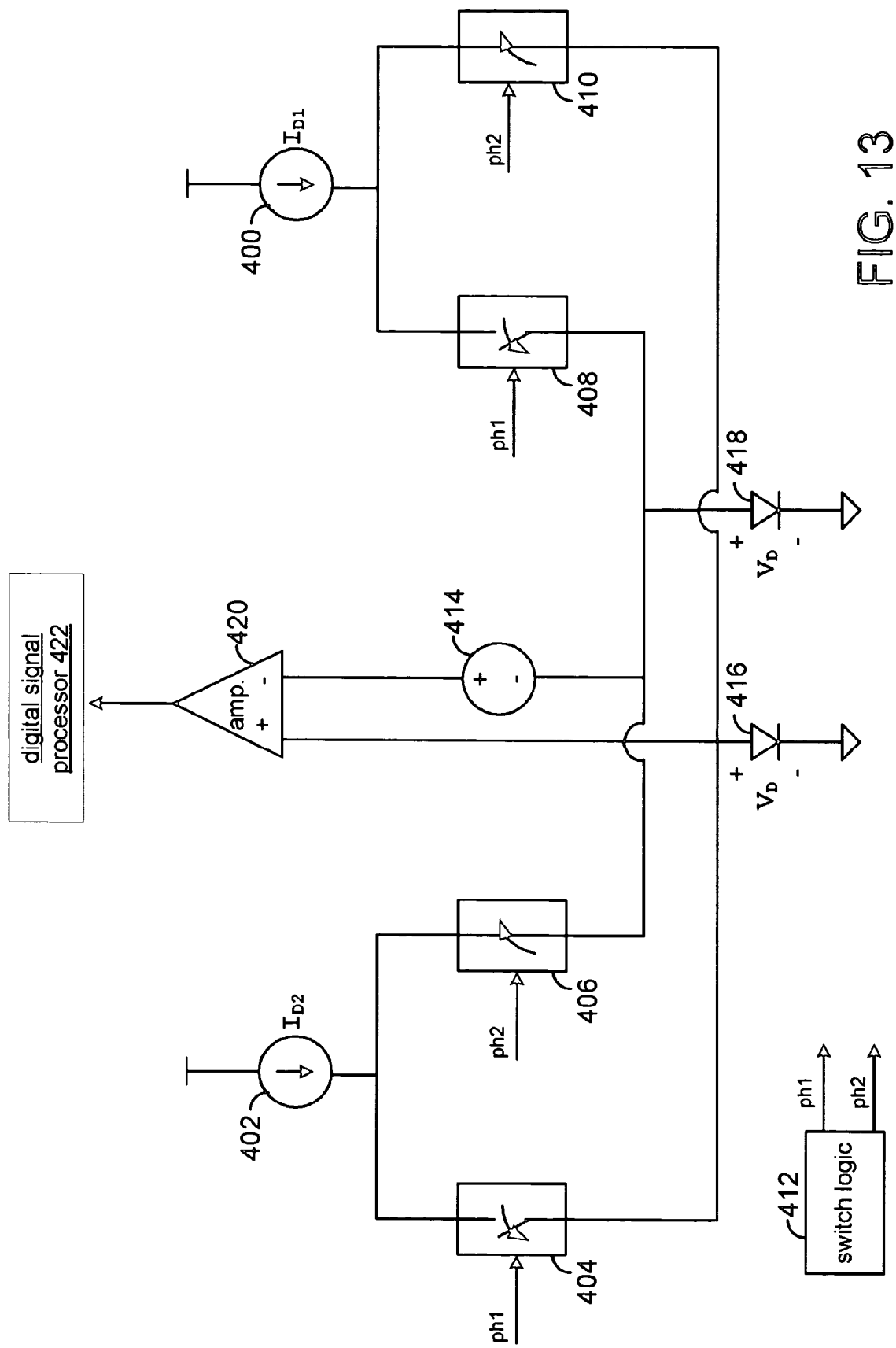
FIG. 13 is a functional schematic block diagram of a simulation model that exemplifies one aspect of the embodiments of the present invention.

FIG. 13 is a functional schematic block diagram of a simulation model that exemplifies one aspect of the embodiments of the present invention. As may be seen, two current sources 400 and 402 are coupled to provide current through a plurality of switches, namely switches 404, 406, 408 and 410. Switches 404 and 408 are operatively coupled to selectively open and close switch connections therewithin based upon a first phase signal ph1, while switches 406 and 410 are operatively coupled to selectively open and close switch connections there within based upon a second phase signal ph2. Logic circuitry 412 produces ph1 and ph2 in a manner wherein ph1 and ph2 are logical opposites. One of average skill in the art may readily implement such logic. The circuit of FIG. 13 further includes a voltage source 414 which represents, in a real circuit, an offset voltage and is included herein to demonstrate that the inventive circuitry and method of an alternate embodiment of the invention may be used to cancel erroneous temperature readings due to offset voltages and device mismatch where two or more temperature sensitive devices are used to indicate temperature or temperature changes. Generally, the simulation model of FIG. 13 represents one embodiment of the present invention wherein voltage source 414 is replaced by an introduced voltage offset. Similarly, switches 404-410 may readily be replaced, for example, by semiconductor devices such as bi-polar junction transistors or MOSFETs, that are operably configured and operated as switches. Thus, switches 404-410 may comprises semiconductor devices that selectively couple two nodes with an appropriate bias voltage and decouple the two nodes when the bias voltage is removed for normally open devices requiring a bias voltage to make the connection. For normally closed devices, the logic is opposite.

As may further be seen, the circuit of FIG. 13 includes diodes 416 and 418 that are used to detect temperature changes. Switches 406 and 408 are coupled to provide current from current sources 402 and 400 to diode 418, while switches 404 and 410 are coupled to provide current from current sources 402 and 400 to diode 416. When ph1 is logically asserted to close switches 404 and 408, diode 416 conducts current from current source 402 while diode 418 conducts current from current source 400. Conversely, when ph2 is asserted, diode 418 conducts current from current source 402 while diode 416 conducts current from current source 400. In the described embodiment, a differential amplifier 420 is coupled to detect a difference between the voltage drops across diodes 416 and 418 and to amplify the detected difference and to produce the amplified output to a digital signal processor 422 that is coupled to receive the amplified output of amplifier 420.

In the described embodiment, current source 402 produces eight times the current density of current source 400. Accordingly, by measuring the voltage drops across diodes 416 and 418, and by switching the current magnitudes as described herein, and by subtracting the voltage values, any offset introduced is subtracted leaving only voltage drops due to the current through the diodes. Referring again to FIG. 12, if the temperature-voltage curve 392 is shifted, for example, to temperature curve 394 due to offset voltage or device mismatch, the inversion of the voltage drops across diodes 416 and 418 will result in temperature curve 396 being generated for comparison to temperature-voltage curve 394 to facilitate the accurate detection of voltage-temperature curve 392. Accordingly, as one or both of the diodes experience an increase in temperature (and therefore voltage drop) such increase may accurately be measured. Moreover, a voltage value used as an index by a digital signal processor to a mapping between voltage and temperature will be accurate thereby facilitating accurate temperature determination.

Figure 14:
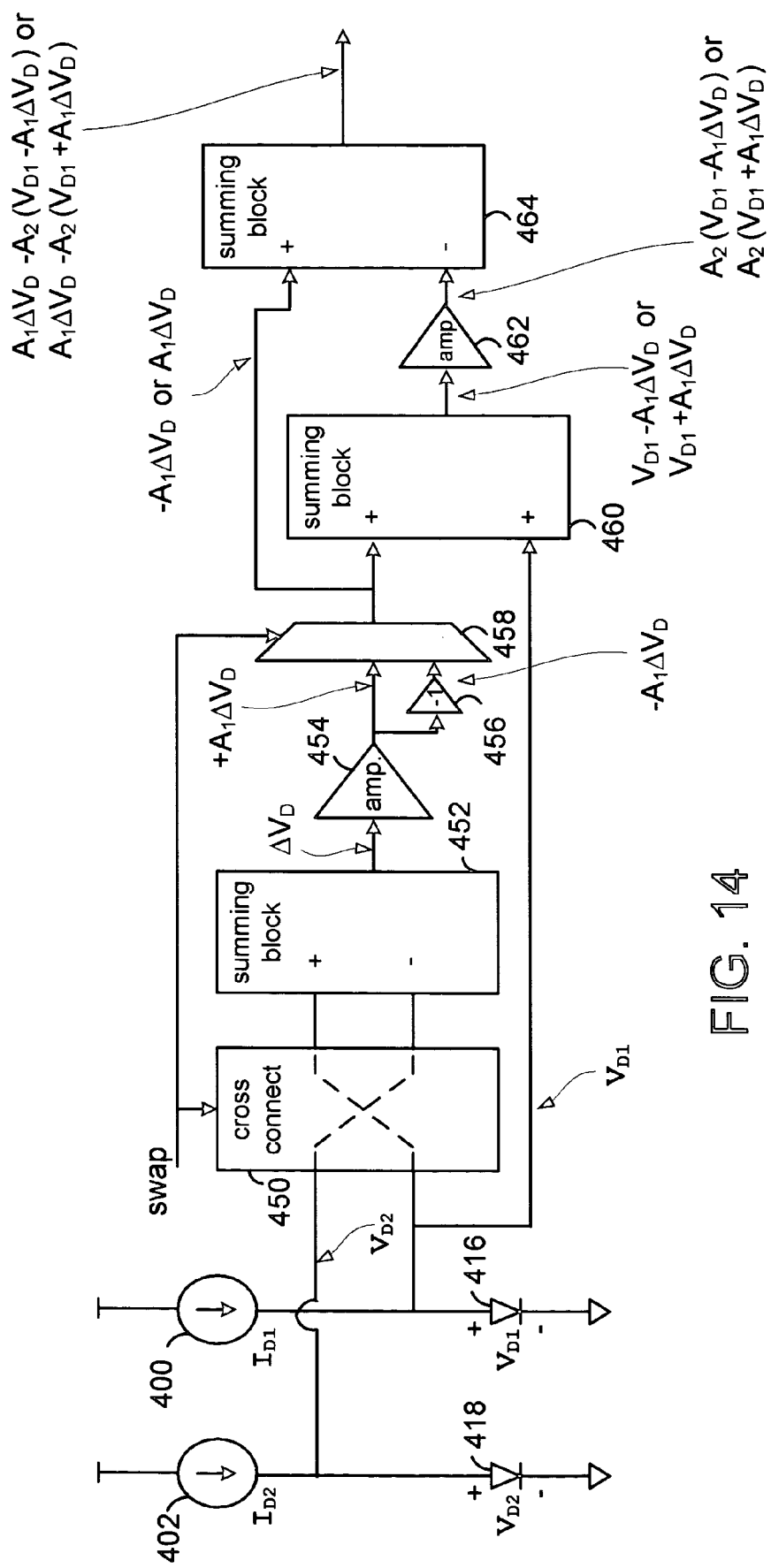
FIG. 14 is a functional schematic block diagram of a circuit that performs common mode rejection for a temperature sensing circuit according to one embodiment of the present invention.

FIG. 14 is a functional schematic block diagram of a circuit that performs common mode rejection for a temperature sensing circuit according to one embodiment of the present invention. As may be seen, current sources 400 and 402 provide current for semiconductor temperature devices, namely, diodes 416 and 418, respectively. The voltage drops $V_{D1}$ and $V_{D2}$ across diodes 416 and 418 are produced to a cross connect block 450 that is further operatively coupled to cross connect inputs upon receiving a logically asserted swap signal. Without the logically asserted swap signal, the inputs are passed straight through. Outputs of cross connect block 450 are then produced to a summing block 452 that determines a difference in the two inputs. The polarity of the output of the summing block 452, of course, will depend on whether cross connect block 450 passed the voltage drops straight through or cross connected them. The outputs of summing block 452 are then produced to an amplifier 454. The output is equal to either $V_{D1}-V_{D2}$ or, alternatively, $V_{D2}-V_{D1}$ and may be represented by $\Delta V_D$. The output of amplifier 454, therefore, is equal to $A_1 \Delta V_D$. As may further be seen, however, the output of amplifier 454 is further produced to an inverter 456. Accordingly, the output of inverter 456 is equal to $-A_1 \Delta V_D$. Both the outputs of amplifier 454 and inverter 456 are then produced to a multiplexer that receives the same logically asserted swap signal that prompts cross connect block 450 to swap the inputs. Accordingly, the swap signal further results in either the output of amplifier 454 or inverter 456 being produced to a summing block 460 and to a summing block 464. The output of multiplexer 458, therefore, is equal to either $-A_1 \Delta V_D$ or $+A_1 \Delta V_D$. Summing block 460, as may also be seen, is further coupled to receive $V_{D1}$. As summing block 460 is a positive summing block, rather than one that detects a difference as in the case of summing block 452, the output of summing block 460 is equal to either $V_{D1}+A_1\Delta V_D$ or $V_{D1}-A_1\Delta V_D$. The output of summing block 460 is then produced to an amplifier 462 which therefore produces an output of $A_2 V_{D1}+A_2 A_1 \Delta V_D$ or $A_2 V_{D1}-A_2 A_1 \Delta V_D$. The output of amplifier 462 is produced to summing block 464 which again detects a difference of the inputs. Accordingly, the output of summing block 464 is equal to $A_1 \Delta V_D - A_2 (V_{D1}+A_1\Delta V_D)$. As such, it may be seen that a common-mode signal is subtracted, thereby producing a voltage value that is a function of a voltage drop across diodes 416 and 418 to facilitate changes therein due to temperature changes.

Without the circuitry of FIG. 14, any downstream amplification would typically amplify a common mode signal thereby rendering it difficult to accurately detect and process small voltage changes due to temperature changes. Stated differently, an amplified common mode may easily take the range of the sensor reading out of the range of a low order analog-to-digital converter. Accordingly, removing any common mode signal, including DC offsets, when the signal of interest is small, facilitates the use of a lower order analog-to-digital converter.

Figure 15:
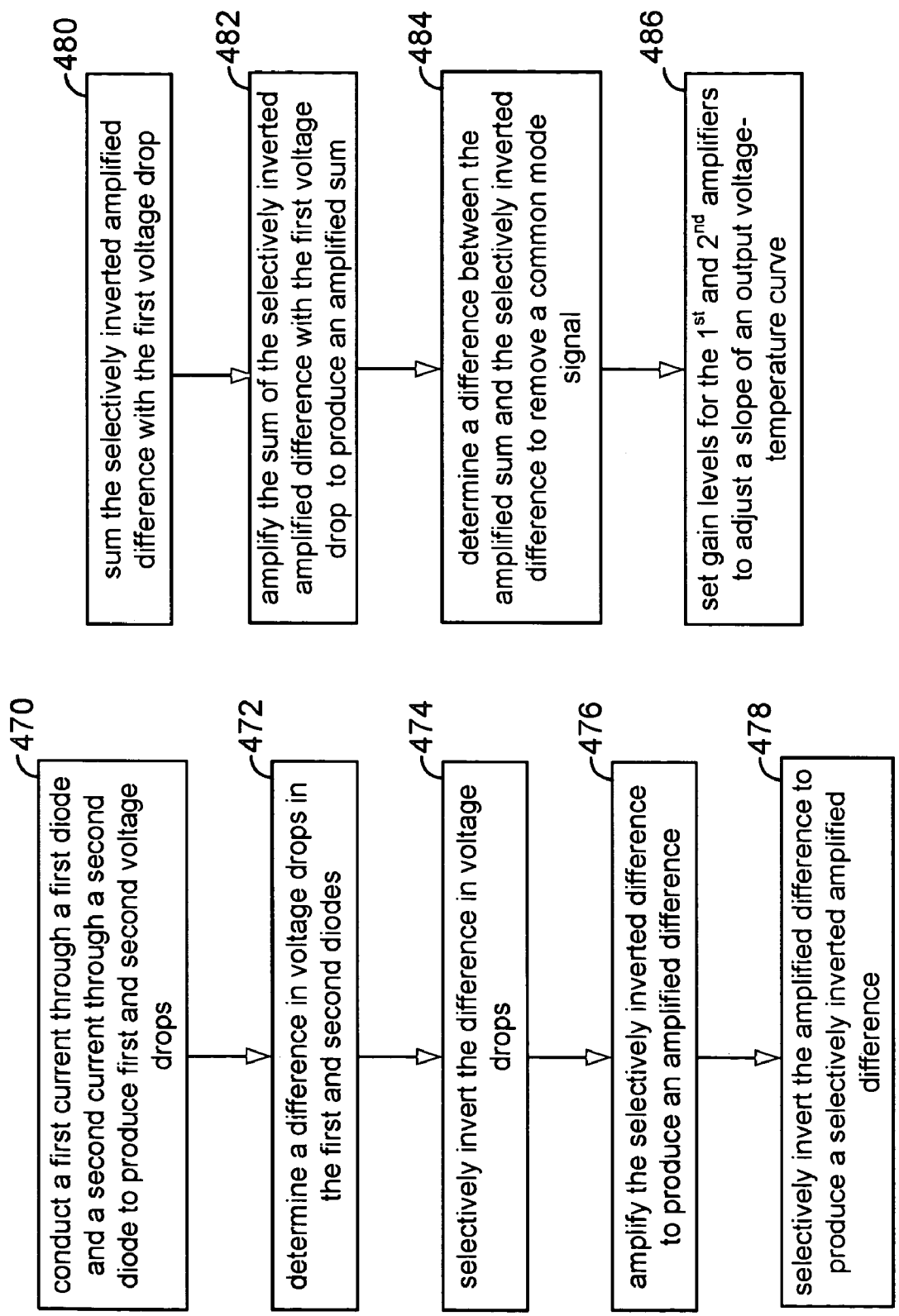
FIG. 15 is a flowchart that illustrates a method for removing a common mode signal for a temperature sensor according to one embodiment of the present invention.

FIG. 15 is a flowchart that illustrates a method for removing a common mode signal for a temperature sensor according to one embodiment of the present invention. Initially, a first current is conducted through a first diode and a second current is conducted through a second diode (step 470). Thereafter, the embodiment of the inventive method includes determining a difference in voltage drops across the first and second diodes (step 472). Thereafter, the embodiment of the present invention includes selectively inverting the difference in the voltage drops across the first and second diodes (step 474). The selectively inverted difference is then amplified (step 476). In relation to the circuit of FIG. 14, a cross connect on the inputs of a summing block that determines the difference in voltage drops is used to selectively invert the output of the summing block. Since the summing block has positive and negative inputs, inverting the inputs merely results in an inversion of the output signal value. In an alternate embodiment of the invention, a selective inverter may be placed on the output of the summing block in place of the cross connect block on the input of the summing block. For example, as will be described below, a combination of a multiplexer and an inverting amplifier may be used to selectively invert the output of the summing block.

After the amplification step of step 476, the invention includes selectively inverting the amplified difference (step 478) and summing the selectively inverted amplified difference with the first voltage drop (step 480). The output of the sum of the selectively inverted amplified difference with the first voltage drop is then amplified (step 482). Thereafter, the embodiment of the present invention includes determining a difference between the amplified sum and the selectively inverted difference to remove a common mode signal (step 484). Finally, one embodiment of the present invention includes setting gain levels for the first and second amplifiers to adjust a slope and location of an input voltage temperature curve (step 486). As may be seen, the above described method relates to, but does not strictly require, the circuitry of FIG. 14. Generally, though, the method includes inverting a signal on a repetitive basis and summing the inverted signals so as to remove any common mode signal values.

Figure 16:
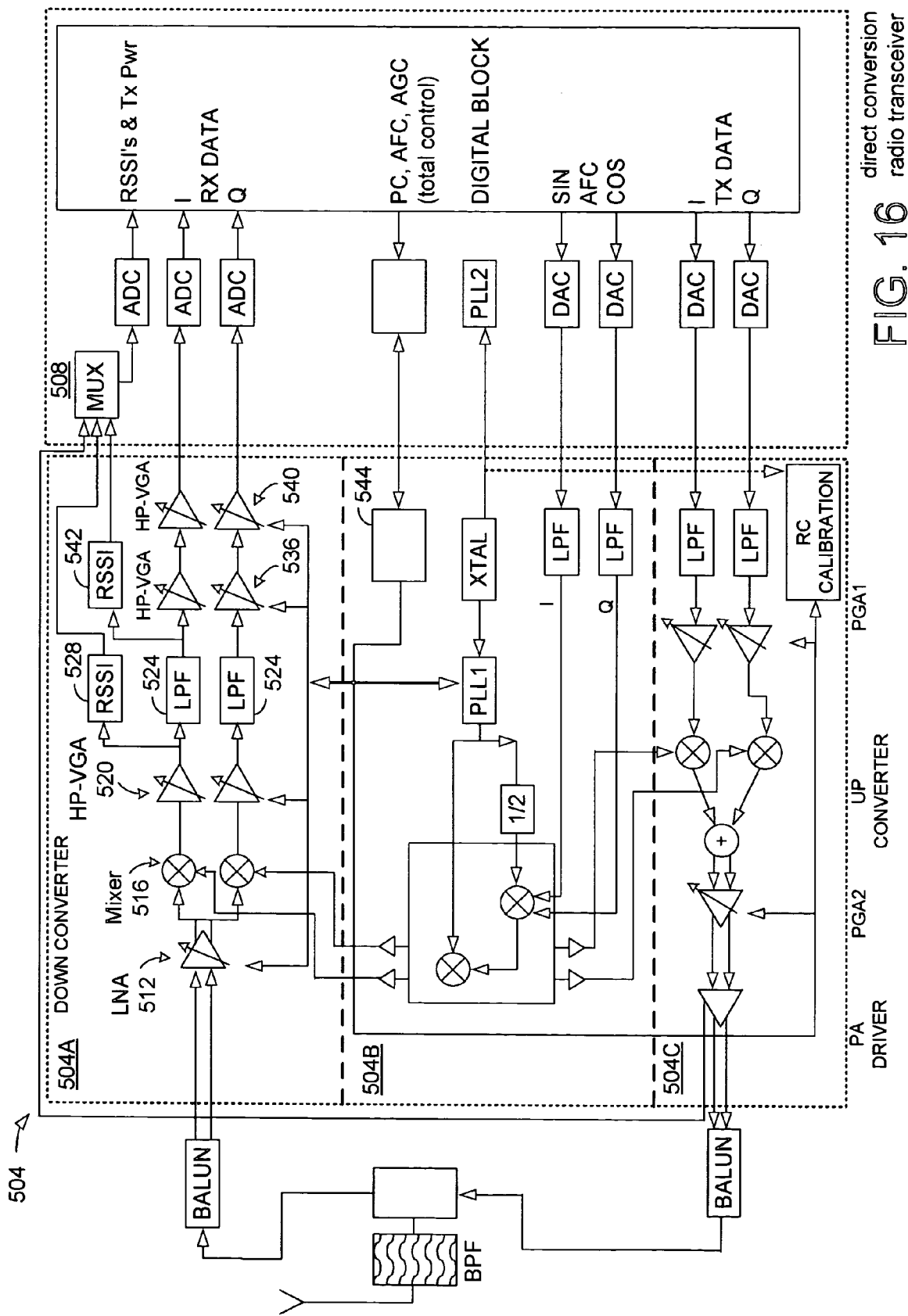
FIG. 16 is a functional schematic diagram of a direct conversion radio transceiver including a temperature sensor according to one embodiment of the present invention.

FIG. 16 is a functional schematic diagram of a direct conversion radio transceiver including a temperature sensor according to one embodiment of the present invention. Referring now to FIG. 16, a transceiver system comprises a single chip radio circuitry 504 that is coupled to baseband processing circuitry 508. The radio circuitry 504 performs filtering, amplification, frequency calibration (in part) and frequency conversion (down from the RF to baseband and up from baseband to the RF). Baseband processing circuitry 508 performs the traditional digital signal processing in addition to partially performing the automatic frequency control. As may be seen, the single chip radio circuitry 504 is coupled to receive radio signals that are initially received by the transceiver and then converted by a Balun signal converter, which performs single end to differential conversion for the receiver (and differential to single end conversion for the transceiver end). The Balun signal converters are shown to be off-chip in FIG. 16, but they may be formed on-chip with radio circuitry 504 as well. Similarly, while the baseband processing circuitry 508 is shown off-chip, it also may be formed on-chip with radio circuitry 504.

Radio circuitry 504 and, more particularly, circuitry portion 504A, includes a low noise amplifier 512 that is coupled to receive RF signals from a transceiver port. The low noise amplifier 512 then produces an amplified signal to mixers 516 that are for adjusting and mixing the RF with a local oscillation signal. The outputs of the mixers 516 (I and Q components of quadrature phase shift keyed signals) are then produced to a first HP-VGA 520. The outputs of the first HP-VGA 520 are then produced to a first RSSI 528, as well as to a low pass filter 524. The outputs of the low pass filter 524 are then produced to a second RSSI 542, as well as to a second HP-VGA 536 and a third HP-VGA 540, as may be seen in FIG. 16. While not shown explicitly in FIG. 16, the temperature sensors disclosed herein may be used in a plurality of circuit locations to measure temperature effects. For example, it is often desirable to detect temperature changes for amplifier circuits including the power amplifier, oscillation circuits (for example, to correct for I/Q mismatch), etc.

In operation, the first RSSI 528 measures the power level of the signal and interference. The second RSSI 542 measures the power level of the signal only. The baseband processing circuitry 508 then determines the ratio of the RSSI measured power levels to determine the relative gain level adjustments of the front and rear amplification stages. In the described embodiment of the invention, if the power level of the signal and interference is approximately equal to or slightly greater than the power level of the signal alone, then the first amplification stages are set to a high value and the second amplification stages are set to a low value. Conversely, if the power level of the signal and interference is significantly greater than the power of the signal alone, thereby indicating significant interference levels, the first amplification stages are lowered and the second amplification stages are increased proportionately.

Circuitry portion 504B includes low pass filters for filtering I and Q component frequency correction signals and mixer circuitry for actually adjusting LO signal frequency. The operation of mixers and phase locked loop for adjusting frequencies is known. Circuitry portion 504B further includes JTAG (Joint Test Action Group, IEEE1149.1 boundary-scan standard) serial interface (SIO) circuitry 544 for transmitting control signals and information to circuitry portion 504A (e.g., to control amplification levels) and to a circuitry portion 504C (e.g., to control or specify the desired frequency for the automatic frequency control).

A portion of the automatic frequency control circuitry that determines the difference in frequency between a specified center channel frequency and an actual center channel frequency for a received RF signal is formed within the baseband circuitry in the described embodiment of the invention. This portion of the circuitry includes circuitry that coarsely measures the frequency difference and then measures the frequency difference in the digital domain to obtain a more precise measurement and to produce frequency correction inputs to circuitry portion 504B. Finally, radio circuitry portion 504C includes low pass filtration circuitry for removing any interference that is present after baseband processing, as well as amplification, mixer and up-converter circuitry for preparing a baseband signal for transmission at the RF.

The direct conversion radio transceiver of FIG. 16 is provided to illustrate one embodiment of the invention of a direct conversion radio transceiver. While not all of the disclosed and claimed circuit elements are shown specifically in FIG. 16, it is understood that the various embodiments of the invention disclosed herein may be implemented within a direct conversion radio transceiver as shown herein FIG. 16, among other applications. For example, the disclosed and claimed circuit elements are coupled to and operate within a system similar to that shown in FIGS. 3-5. As shown here in FIG. 16, the HP-VGAs 520 and/or 536 and 540 are coupled to receive gain level control inputs from a gain determination circuit, as also illustrated in the embodiments of FIGS. 5, 8 and 9, based upon a temperature sensor as illustrated in FIG. 10.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention. For example, references to operation of a digital signal processor also may apply to baseband processors and vice-versa. Similarly, any combination of the teachings herein may be modified to achieve similar but different results.

What is claimed is:

1. A direct conversion Radio Frequency (RF) transceiver integrated circuit comprising:

a local oscillator that generates an RF local oscillation signal corresponding to an RF channel;

a receiver section operably coupled to the local oscillator that receives an incoming RF signal and down converts the incoming RF signal based upon the RF local oscillation signal to produce a baseband signal;

a transmitter section of the integrated circuit operably coupled to the local oscillator that receives an outgoing baseband signal and up converts the outgoing baseband signal to produce an outgoing RF signal; and wherein the transmitter section further comprises:

a heat generating circuit;

a temperature sensing module operable to produce an indication of an operating temperature of the heat generating circuit wherein the temperature sensing module is operable to apply a first current continuously through a semiconductor device and to periodically apply a supplemental current through the semiconductor device to generate proportional-to-absolute temperature responses and to produce the proportional-to-absolute temperature responses to at least a 16 bit high resolution analog-to-digital converter to allow a digital processor to make gain setting determinations based on minor changes in temperature; and logic to adjust a gain setting for each of a plurality of adjustable gain elements each operably having a gain setting that is based upon the indication of the operating temperature provided by the temperature sensing module wherein each gain setting is adjusted so that a total gain level remains constant.

2. The direct conversion RF transceiver of claim 1, wherein:

wherein the temperature sensing module is thermodynamically coupled to a power amplifier that produces an indication of a temperature of the power amplifier; and wherein at least one adjustable gain element adjusts its gain setting based upon the indication of the temperature of the power amplifier.

3. The direct conversion RF transceiver of claim 2 wherein the temperature sensing module further comprises first and second current sources operatively coupled to provide a current through a diode wherein second current source is selectable.

4. The direct conversion RF transceiver of claim 3 further comprising a high resolution analog-to-digital converter coupled to detect a voltage drop across a diode for temperature sensing purposes, wherein the analog-to-digital converter produces digitized diode voltage values for storage and processing.

5. The direct conversion RF transceiver of claim 4 further including a digital signal processor including logic for determining a diode temperature based upon the digitized diode voltage values.

6. The direct conversion RF transceiver of claim 5 wherein the digital signal processor further includes a mapping of digitized voltage values to temperature values.

7. The direct conversion RF transceiver of claim 5 further including temperature test logic for selectively coupling the second current source in a first temperature detection mode and for selectively decoupling the second current source in a second temperature detection mode.

8. The direct conversion RF transceiver of claim 7 wherein the temperature test logic is defined within the digital signal processor.

9. The direct conversion RF transceiver of claim 8 wherein the temperature test logic within the digital signal processor selectively couples the second current source to provide current to the diode to provide temperature readings in a first temperature state.

10. The direct conversion RF transceiver of claim 9 wherein the digital signal processor stores one of the digitized diode voltage values or the corresponding temperature values in the first temperature state.

11. The direct conversion RF transceiver of claim 10 wherein the digital signal processor stores one of the digitized diode voltage values or the corresponding temperature values in a second temperature state wherein the second current source is selectively decoupled to obtain voltage values in the second temperature state.

12. A temperature sensor thermodynamically coupled to a power amplifier formed as a part of an integrated circuit, wherein the sensor produces an indication of an operating temperature of power amplifier within the integrated circuit, comprising:

a diode that is thermodynamically coupled to the power amplifier, wherein the diode produces a voltage drop as a temperature indication of a temperature of the heat generating circuit;

logic to apply a plurality of specified current levels to the diode wherein at least one current is applied continuously and at least one current is added to the continuous current to obtain a plurality of voltage drops as temperature indications;

circuitry operable to produce the voltage drops across the diode to a digital processor; and logic for determining a temperature based upon the indication.

13. The temperature sensor of claim 12 wherein the temperature sensor further comprises first and second current sources operatively coupled to provide a current through a diode wherein at least one of the first and second current sources is selectable.

14. The temperature sensor of claim 13 further comprising a high resolution analog-to-digital converter coupled to detect a voltage drop across a diode for temperature sensing purposes, wherein the analog-to-digital converter produces digitized diode voltage values.

15. The temperature sensor of claim 14 further including a digital signal processor including logic for determining a diode temperature based upon the digitized diode voltage values.

16. The temperature sensor of claim 15 wherein the digital signal processor further includes a mapping of digitized voltage values to temperature values.

17. The temperature sensor of claim 15 further including temperature test logic for selectively coupling at the second current source in a first temperature detection mode and for selectively decoupling the second current source in a second temperature detection mode.

18. The temperature sensor of claim 17 wherein the temperature test logic is defined within the digital signal processor.

19. The temperature sensor of claim 18 wherein the temperature test logic within the digital signal processor selectively couples the second current source to provide current to the diode to provide temperature readings in a first temperature state.

20. The temperature sensor of claim 19 wherein the digital signal processor stores one of the digitized diode voltage values or the corresponding temperature values in the first temperature state.

21. The temperature sensor of claim 20 wherein the digital signal processor stores one of the digitized diode voltage values or the corresponding temperature values in a second temperature state wherein the second current source is selectively decoupled to obtain voltage values in the second temperature state.

22. A method in an integrated circuit for determining an operating temperature of a heat generating circuit within the integrated circuit, comprising:
  conducting a first current having a first current level through a first semiconductor device and a second current having a second current level through a second semiconductor device;
  detecting a first voltage drop across the first semiconductor device;
  detecting a second voltage drop across the second semiconductor device;
  applying the first and second voltage drops to positive and negative inputs, respectively, of a summing block and amplifying the output of the summing block and subsequently applying the first and second voltage drops to negative and positive inputs, respectively, of the summing block and amplifying the output of the summing block;
  determining and subtracting a common mode value of the first and second voltage drops; and
  producing temperature readings for the first and second semiconductor devices without the common mode value and setting a gain level of at least one variable gain devices based upon the temperature readings for the first and second semiconductor devices without the common mode value.

23. The method of claim 22 further including the step applying a control signal to a cross connect and to a multiplexer that is operably disposed to a positive and a negative amplified output of a summing block.

24. The method of claim 22 further including producing temperature readings that reflect changes in temperature to a low order analog-to-digital converter.

25. The method of claim 22 further including adjusting gain levels of first and second variable gain amplifiers based upon temperature readings of the first and second semiconductor devices.

26. The method of claim 25 wherein the total gain of an integrated circuit device remains constant as the first and second gain levels are adjusted.

* * * * *